US012771305B2

(12) United States Patent
Papanikolaou et al.

(10) Patent No.: US 12,771,305 B2
(45) Date of Patent: Oct. 20, 2026

(54) CONTROLLING AMPLIFIER REGULATORS BASED ON AUTOMATIC GAIN CONTROL STATE

(71) Applicant: MACOM Technology Solutions Holdings, Inc., Lowell, MA (US)

(72) Inventors: Vasilis Papanikolaou, Lowell, MA (US); John Francis, Lowell, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 514 days.

(21) Appl. No.: 18/232,901

(22) Filed: Aug. 11, 2023

(65) Prior Publication Data

US 2025/0055433 A1 Feb. 13, 2025

(51) Int. Cl.
*H03G 3/30* (2006.01)
*H03F 1/32* (2006.01)
*H03F 3/45* (2006.01)

(52) U.S. Cl.
CPC ......... *H03G 3/3042* (2013.01); *H03F 1/3211* (2013.01); *H03F 3/45475* (2013.01)

(58) Field of Classification Search
CPC .. H03G 3/3042; H03G 3/3084; H03F 1/3211; H03F 3/45475; H03F 3/087
USPC ........................................ 330/297, 279, 134
See application file for complete search history.

(56) References Cited

U.S. PATENT DOCUMENTS

| | | | | |
|---|---|---|---|---|
| 8,078,122 | B2 | 12/2011 | Sahota et al. | |
| 8,525,595 | B2 * | 9/2013 | Berchtold | H03G 3/004 330/296 |
| 10,116,263 | B1 | 10/2018 | Broekaert | |
| 11,722,109 | B1 * | 8/2023 | Zhang | H03G 3/3089 250/214 A |
| 2020/0162169 | A1 | 5/2020 | Papanikolaou et al. | |

* cited by examiner

*Primary Examiner* — Hieu P Nguyen
(74) *Attorney, Agent, or Firm* — Jason H. Vick; Amped IP LLC

(57) ABSTRACT

Adjustments to supply voltage level associated with an amplifier can be controlled based on a state associated with an automatic gain control (AGC) component associated with the amplifier. The AGC component can determine the AGC state based on an output signal associated with the amplifier component. Supply voltage controller component (SVCC) of an amplifier regulator can control a supply voltage level of a supply voltage supplied to the amplifier component by the amplifier regulator based on a state value indicative of the AGC state and received from AGC component, and a threshold supply voltage level associated with a threshold state value. If the state value does not satisfy threshold state value, SVCC adjusts or maintains supply voltage at the threshold supply voltage level. If the state value satisfies threshold state value, SVCC adjusts or maintains supply voltage at a desired supply voltage level that corresponds to the AGC state.

20 Claims, 9 Drawing Sheets

CONTROLLING AMPLIFIER REGULATORS BASED ON AUTOMATIC GAIN CONTROL STATE

TECHNICAL FIELD

The subject disclosure relates generally to electronic circuitry, e.g., to controlling amplifier regulators based on an automatic gain control state.

BACKGROUND

Many types of electrical devices can employ amplifiers to process or amplify electrical signals (e.g., voltage signals or other signals). For example, a transimpedance amplifier (TIA) can be utilized to convert a current signal to a voltage signal and/or amplify the voltage signal (e.g., apply a gain to the voltage signal). As another example, a voltage gain amplifier (VGA) can receive a voltage signal and can amplify the voltage signal by applying a gain to the voltage signal. These and other types of amplifiers can be utilized, along with other types of electronic components, to enable a device to perform desired functions or operations.

The above-described description is merely intended to provide a contextual overview relating to existing technology and is not intended to be exhaustive.

SUMMARY

The following presents a simplified summary in order to provide a basic understanding of some aspects described herein. This summary is not an extensive overview of the disclosed subject matter. It is intended to neither identify key or critical elements of the disclosure nor delineate the scope thereof. Its sole purpose is to present some concepts in a simplified form as a prelude to the more detailed description that is presented later.

In some embodiments, the disclosed subject matter can comprise a system that can facilitate control of supply voltage levels. The system can comprise a group of amplifier components, comprising an amplifier component, wherein the group of amplifier components can receive an input signal, wherein the group of amplifier components can generate a voltage signal based at least in part on the input signal, and wherein an output signal of the system can be based at least in part on the voltage signal. The system also can comprise an automatic gain control component associated with the group of amplifier components, wherein the automatic gain control component can determine a state value associated with the automatic gain control component, based at least in part on an analysis of the output signal. The system further can comprise a supply voltage controller component that can receive state information indicative of the state value from the automatic gain control component and can control a supply voltage level of a supply voltage supplied by an amplifier regulator component to the amplifier component based at least in part on the state value and a threshold supply voltage level associated with a threshold state value.

In certain embodiments, the disclosed subject matter can comprise a device that can facilitate management of supply voltage levels. The device can include a group of amplifier components, comprising an amplifier component, wherein the group of amplifier components can receive an input signal, wherein the group of amplifier components can generate a voltage signal based at least in part on the input signal, and wherein an output signal associated with the group of amplifier components can be based at least in part on the voltage signal. The device also can comprise an automatic gain control component associated with the group of amplifier components, wherein the automatic gain control component can determine a state value associated with the automatic gain control component, based at least in part on an analysis of the output signal. The device further can comprise a supply voltage controller component that can receive a state signal indicative of the state value from the automatic gain control component and can manage a supply voltage level of a supply voltage supplied by an amplifier regulator component to the amplifier component based at least in part on a result of a determination of whether the state value satisfies a threshold state value associated with a threshold supply voltage level.

In still other embodiments, the disclosed subject matter can comprise a method that can facilitate controlling supply voltage levels. The method can comprise determining a state value indicative of a state associated with an automatic gain control component based at least in part on analysis of an output signal associated with a group of amplifiers, comprising an amplifier, associated with the automatic gain control component. The method also can comprise controlling a supply voltage level of a supply voltage supplied to the amplifier component based at least in part on a threshold supply voltage level associated with a threshold state value, and state information indicative of the state value and received from the automatic gain control component.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
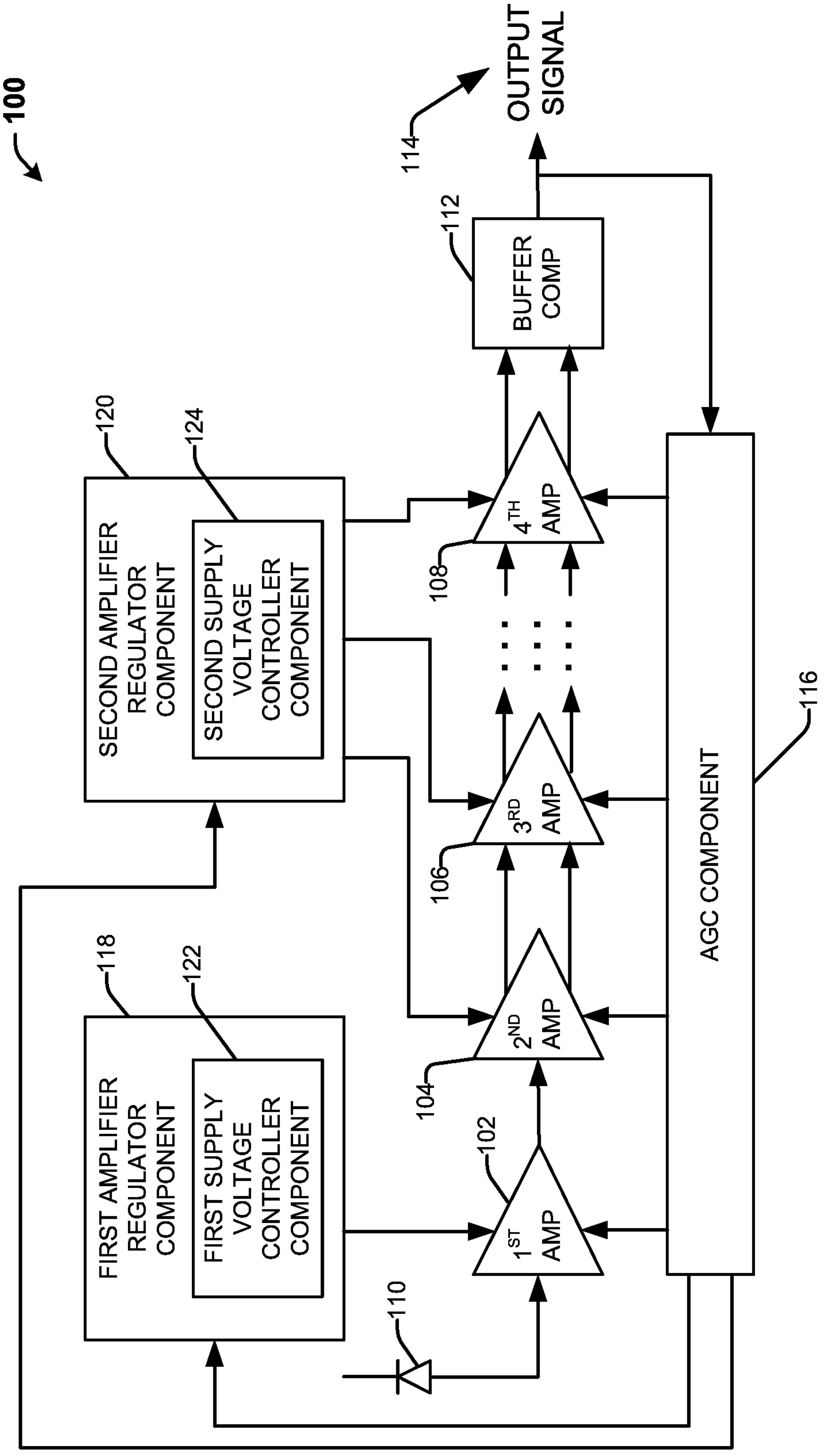
FIG. 1 illustrates a block diagram of a non-limiting example system that can desirably control adjustments to supply voltage levels of supply voltages supplied by amplifier regulators to amplifier components, in accordance with various aspects and embodiments of the disclosed subject matter.

The disclosure herein is described with reference to the drawings, wherein like reference numerals are used to refer to like elements throughout. In the following description, for purposes of explanation, numerous specific details are set forth in order to provide a thorough understanding of the disclosed subject matter. It may be evident, however, that various disclosed aspects can be practiced without these specific details. In other instances, well-known structures and devices are shown in block diagram form in order to facilitate describing the disclosed subject matter.

Many types of electrical devices can employ amplifiers, such as a transimpedance amplifier (TIA) and/or a voltage gain amplifier (VGA), to process or amplify electrical signals (e.g., voltage signals or other signals). The amplifiers can be utilized, along with other types of electronic components, to enable a device to perform desired functions or operations.

Some devices can employ multiple amplifiers that each can apply gain to an input electrical signal (e.g., in succession) to increase the level of the signal to produce an output signal that can have a desired output voltage level. As the input signal increases in level, it may be desirable to reduce the gain of one or more of the amplifiers to achieve the desired (e.g., target or wanted) output voltage level, and as the input signal decreases in level, it may be desirable to increase the gain of one or more of the amplifiers to achieve the desired output voltage level.

For instance, a device can employ a set of amplifiers, such as four amplifiers, where the amplifiers can be connected to form a chain of amplifiers (e.g., first amplifier output connected to input of second amplifier, output of second amplifier connected to the input of the third amplifier, and output of the third amplifier connected to the input of the fourth amplifier) that can receive an input signal (e.g., input current signal) at the first amplifier (e.g., TIA) and produce an output voltage signal as an output from the fourth (e.g., last) amplifier (e.g., VGA), via a buffer, with one or more amplifiers applying gain to the signal as the signal proceeds through the chain of amplifiers. If the gain associated with the amplifiers is to be reduced, for example, by an automatic gain control (AGC) component) due to an increase in the input signal, the gain of one or more of the amplifiers can be reduced by the AGC component. However, if an amplifier, such as a TIA amplifier, is at low gain (e.g., in response to a higher power input signal), there may be undesirable peaking (e.g., undesirable peaking at overload) in the data points in a graph of the transfer function of the transimpedance of the amplifier as a function of frequency, which can negatively impact performance of the amplifier and the output signal. It can be desirable to mitigate (e.g., reduce or minimize) such undesirable peaking in data points in a graph of a transfer function of transimpedance of the amplifier as a function of frequency.

If, instead, the amplifier is at higher gain (e.g., in response to a lower power input signal), due to the gain associated with the amplifiers being increased, for example, by the AGC component due to a decrease in the input signal, there may be undesirable bandwidth (e.g., undesirably lower bandwidth at sensitivity) associated with the amplifier, particularly when a supply voltage at a supply voltage level is provided to the amplifier using existing techniques. However, again, some existing techniques for providing supply voltages to amplifiers typically determine and provide supply voltages at supply voltage levels without regard to the gains of the amplifiers, including without regard to how the AGC component is changing gain levels of amplifiers. It can be desirable to mitigate such undesirable reduction in bandwidth associated with the amplifier, and/or enhance (e.g., increase) bandwidth associated with the amplifier when the amplifier is at higher gain levels.

Further, it can be desirable to enhance (e.g., improve, lower, or optimize) a bit error rate (BER) floor (e.g., BER at midband) associated with the amplifier across various gain levels associated with the set of amplifiers. It also can be desirable for the output signal from the set of amplifiers to have a maximally flat frequency response. However, existing techniques for changing gain levels of amplifiers can result in an undesirable BER floor associated with amplifiers and an undesirably frequency response.

Thus, existing techniques can provide undesirable (e.g., deficient, unsuitable, or otherwise undesirable) characteristics with regard to sensitivity, overload, bandwidth, BER floor, frequency response, transimpedance, or other attributes associated with amplifiers.

The disclosed subject matter can overcome these and other deficiencies of existing systems, devices, and techniques relating to operation of amplifiers, including changing gain levels of amplifiers.

In accordance with various embodiments, the disclosed subject matter can comprise a system that can comprise a group of amplifier components, comprising a first amplifier component (e.g., a TIA or other desired type of amplifier component), a second amplifier component (e.g., a VGA), a third amplifier component (e.g., another VGA), a fourth amplifier component (e.g., still another VGA), and/or one or more other amplifier components. The first amplifier component can receive an input signal, such as an input current signal (e.g., from a photodiode or other electronic component) and can generate a first voltage signal having a first voltage level that can be based at least in part on a first gain level associated with the first amplifier component. The second amplifier component can receive the first voltage signal from the first amplifier component, and can generate a second voltage signal having a second voltage level based at least in part on the first voltage level of the first voltage signal and a second gain level associated with the second amplifier component. The third amplifier component can receive the second voltage signal from the second amplifier component, and can generate a third voltage signal having a third voltage level based at least in part on the second voltage level of the second voltage signal and a third gain level associated with the third amplifier component. The fourth amplifier component can receive the third voltage signal from the third amplifier component, and can generate a fourth voltage signal having a fourth voltage level based at least in part on the third voltage level of the third voltage signal and a fourth gain level associated with the fourth amplifier component. The system can provide an output signal that can be based at least in part on the fourth voltage signal. In some embodiments, the output signal can be provided to another device or system for further use or processing.

In certain embodiments, the system also can comprise an AGC component, and the output signal also can be provided to the AGC component, which can be part of an AGC or feedback loop of the system. The AGC component can control respective gain levels of the respective amplifier components of the group of amplifier components based at least in part on the output signal. For instance, the AGC component can determine a state (e.g., AGC state) that the AGC component is in at a particular time based at least in part on the result of analyzing the output signal (e.g., an output voltage swing or other characteristic of the output voltage signal) at the particular time. The AGC component can control the respective gain levels associated with the respective amplifier components based at least in part on the state (e.g., AGC state) associated with the AGC component at that particular time. For instance, if the state value representative of the state is a relatively lower value, which can be indicative of or can correlate to a relatively lower amount of input power of the input signal (e.g., input current signal to the TIA amplifier component), the AGC component typically can control and/or adjust one or more respective gain levels of one or more of the respective amplifier components to have the one or more respective gain levels be relatively higher, which can facilitate higher gain. If, instead, the state value representative of the state is a relatively higher value, which can be indicative of or can correlate to a relatively higher amount of input power of the input signal, the AGC component typically can control and/or adjust one or more respective gain levels of one or more of the respective amplifier components to have the one or more respective gain levels be relatively lower, which can facilitate lower gain. To facilitate adjustment of a gain level associated with the group of amplifier components, the AGC component can generate a control signal, and can provide the control signal to the desired amplifier component to facilitate adjusting (e.g., increasing or decreasing) the gain level of the desired amplifier component.

The system also can comprise amplifier regulator components that can be associated with (e.g., electrically connected to) and regulate supply voltages supplied to the amplifier components. For instance, there can be a first amplifier regulator component (e.g., TIA regulator component) that can be associated with the first amplifier component (e.g., TIA component), and a second amplifier regulator component (e.g., VGA regulator component) that can be associated with the other amplifier components (e.g., VGA components). The first amplifier regulator component and the second amplifier regulator component also can be associated with (e.g., electrically connected to) the AGC component and can receive state information, comprising the state value indicative or representative of the AGC state, from the AGC component on a desired time basis (e.g., regularly, constantly or substantially constantly, periodically, or dynamically or aperiodically).

In some embodiments, the first amplifier regulator component can comprise a first supply voltage controller component and the second amplifier regulator component can comprise a second supply voltage controller component that can control (e.g., adjust, modify, or maintain) respective supply voltage levels of respective supply voltages that are to be supplied to the respective amplifier components, based at least in part on the state information, comprising the state value. For example, the first supply voltage controller component can determine a desired (e.g., suitable, wanted, target, or optimal) supply voltage level for the supply voltage to be supplied to the first amplifier component based at least in part on the state information (e.g., the AGC state value), a threshold state value associated with a threshold supply voltage level, and a first function or first mapping, relating to (e.g., indicating or specifying) respective supply voltage levels in relation to (e.g., as a function of) respective state values and/or AGC states. Over a middle portion or region of state values, the first function or first mapping relating to respective supply voltage levels can comprise a range of supply voltage levels that can span and/or decrease from the threshold (e.g., first threshold) supply voltage level (e.g., a higher supply voltage level) to a second threshold supply voltage level (e.g., a lower supply voltage level), for example, as the state value increases. If the first supply voltage controller component determines that the state value does not satisfy (e.g., does not exceed) the threshold state value, the first supply voltage controller component can adjust or maintain the supply voltage for the first amplifier component at the threshold supply voltage level, in accordance with the first function or first mapping. If, instead, the first supply voltage controller component determines that the state value satisfies (e.g., exceeds) the threshold state value, the first supply voltage controller component can adjust (e.g., increase) or maintain the supply voltage for the first amplifier component at a desired (e.g., suitable, wanted, target, or optimal) supply voltage level that can correspond to the state value, in accordance with the first function or first mapping relating to respective supply voltage levels in relation to respective state values and/or AGC states.

In a similar fashion, the second supply voltage controller component can determine a desired supply voltage level for the supply voltage to be supplied to the second, third, and/or fourth amplifier components based at least in part on the state information, a threshold state value associated with a threshold supply voltage level, and a second function or second mapping relating to respective supply voltage levels in relation to (e.g., as a function of) respective state values (e.g., respective AGC state values). The threshold state value utilized by the second supply voltage controller component can be same as or different from the threshold state value utilized by the first supply voltage controller component. In some embodiments, the threshold supply voltage level and the second function or second mapping utilized by the second supply voltage controller component can be different from the threshold supply voltage level and the first function or first mapping utilized by the first supply voltage controller component. For instance, the threshold supply voltage level utilized by the second supply voltage controller component with regard to relatively lower state values (e.g., state values below the threshold state value) and/or associated AGC states can be a lower (e.g., lowest) supply voltage level (e.g., same as or different from the second threshold supply voltage level employed by the first supply voltage controller component), and the other threshold supply voltage level utilized by the second supply voltage controller component with regard to relatively higher state values (e.g., state values at or above a second threshold state value) and/or associated AGC states can be a relatively higher (e.g., highest) supply voltage level (e.g., same as or different from the first threshold supply voltage level employed by the first supply voltage controller component), and the second function or second mapping can relate to or indicate respective other supply voltage levels that can span and/or increase from the lower threshold supply voltage level up to the higher threshold supply voltage level as the state value (e.g., AGC state value) increases.

The supply voltage controller components and techniques described herein, by controlling supply voltage levels supplied by amplifier regulator components to the amplifier components can provide enhanced (e.g., improved or optimized) performance of the systems and devices described herein, over existing systems, devices, and techniques relating to providing supply voltages to amplifiers. The supply voltage controller components and techniques described herein can provide for enhanced sensitivity (e.g., improved, increased, or optimized sensitivity), overload (e.g., improved, increased, or optimized overload, such as higher overload in decibel (dB)-milliwatts (dBm) and/or reduced peaking at overload), and/or BER floor (e.g., improved, lower, or optimized BER floor). The supply voltage controller components and techniques described herein can desirably mitigate (e.g., reduce or minimize) undesirable (e.g., unwanted) peaking associated with the output signal, while also desirably mitigating (e.g., reducing or minimizing) compression of the output signal, and can generate an output signal that can have a desirably (e.g., suitably, enhancedly, or optimally) flat response (e.g., a maximally flat frequency response, or virtually, or substantially close to, a maximally flat frequency response), which can be improvements over existing techniques relating to providing supply voltages to amplifiers.

These and other aspects and embodiments of the disclosed subject matter will now be described with respect to the drawings.

FIG. 1 illustrates a block diagram of a non-limiting example system 100 that can desirably (e.g., suitably, acceptably, enhancedly, or optimally) control adjustments to supply voltage levels of supply voltages supplied by amplifier regulators to amplifier components, in accordance with various aspects and embodiments of the disclosed subject matter. The system 100 can be part of, employed by, or associated with a device (e.g., an electrical or electronic device) that can perform desired electrical or electronic functions.

For example, a device can comprise amplifiers, transistors, capacitors, diodes, photodiodes, inductors, voltage supply component(s), optical electronic component(s), and/or other electrical or electronic components that can be respectively arranged and/or connected to form an electrical circuit that can perform desired electrical or electronic functions. For instance, an electrical circuit can employ an amplifier that can receive input signals (e.g., electronic or electrical signals) and can amplify or otherwise process the input signals to generate output signals, wherein the amplifier device can have a gain that can range from unity to a desired gain that can be greater than unity (e.g., one and a half times gain, two times gain, three times gain, four times gain, or other desired gain). An amplifier and/or other type of electrical or electronic component can be utilized in a variety of different types of electronic devices, such as, for example, a receiver, a transmitter, a communication device (e.g., a phone, a mobile phone, a computer, a laptop computer, an electronic pad or tablet, a device that can provide high speed optical communications (e.g., which can be employed in datacenters or for other desired applications), a television, an Internet Protocol television (IPTV), a set-top box, an electronic gaming device, electronic eyeglasses with communication functionality, an electronic watch with communication functionality, other electronic bodywear with communication functionality, or Internet of Things (IoT) devices), optical-related or solar-related devices (e.g., solar cells, communication devices, communication network devices, or other type of electronic device that can employ optical electronic technology; lighting-related devices (e.g., light emitting diode (LED) devices, laser-related devices; optical-related memory device; or other type of lighting-related device that can employ optical electronic technology), or other type of optical-related or solar-related device), vehicle-related electronic devices, appliances (e.g., refrigerator, oven, microwave oven, washer, dryer, or other type of appliance), audio equipment (e.g., stereo system, radio system, or other type of audio equipment), musical equipment (e.g., electric or electronic musical instruments, instrument amplifier, audio signal processor, or other type of musical equipment), or other type of electronic device that can utilize an amplifier and/or other type of electrical or electronic component to facilitate operation of the electronic device. In some embodiments, the system 100 can be part of a receiver component (e.g., an optical receiver component) that can receive signals (e.g., optical or laser signals) from a transmitter component (e.g., an optical transmitter component) via a communication link (e.g., an optical fiber link).

The system 100 can comprise a group of amplifier components, which can include, for example, a first amplifier component ($1^{ST}$ AMP) 102, a second amplifier component ($2^{ND}$ AMP) 104, a third amplifier component ($3^{RD}$ AMP) 106, a fourth amplifier component ($4^{TH}$ AMP) 108, and/or one or more other amplifier components (not shown in FIG. 1 for reasons of brevity and clarity). In some embodiments, the system 100 also can comprise a diode 110 that can be associated with an input (e.g., input port) of the first amplifier component 102, wherein the diode can receive or detect a signal associated with the system 100. In certain embodiments, the diode 110 can be a photodiode that can receive or sense optical signals (e.g., optical or light energy) associated with the system 100, and can generate a current signal (e.g., input current signal) that can be received by the first amplifier component 102 (e.g., at its input port). In other embodiments, a different type of diode or a different type of electronic component can be employed in the system 100.

In some embodiments, the first amplifier component 102 can be a transimpedance amplifier (TIA) component that can receive an input current signal, and can convert the input current signal to a first voltage signal at a first voltage level based at least in part on a first gain level associated with the first amplifier component 102. The first amplifier component 102 can have a variable gain such that its gain level (e.g., first gain level) can be desirably (e.g., suitably, enhancedly, or optimally) varied or adjusted, as desired, from a first minimum gain level (e.g., a first threshold minimum gain level) to a first maximum gain level (e.g., a first threshold maximum gain level) based at least in part on a first gain range (e.g., range from minimum to maximum gain level) associated with the first amplifier component 102. In certain embodiments, the first amplifier component 102 can have a single-ended input and a single-ended output (e.g., single-ended output port). In other embodiments, the first amplifier component 102 can have a differential input and/or a differential output. For example, there can be some applications (e.g., coherent communications applications or other types of applications) where there can be a differential optical signal (e.g., differential optical signal from two photodiodes) that can generate a differential input current signal that can be input to the first amplifier component 102 (e.g., TIA component).

In some embodiments, the second amplifier component 104 can be a variable gain amplifier (VGA) component (e.g., $VGA_0$) that can have an input (e.g., input port) that can be associated with (e.g., electrically or electronically connected to) the output (e.g., output port) of the first amplifier component 102. The second amplifier component 104 can receive the first voltage signal at its input, and can generate a second voltage signal at a second voltage level that can be based at least in part on a second gain level associated with the second amplifier component 104 (e.g., based at least in part on the second gain level applied to the first voltage signal). The gain level (e.g., second gain level) of the second amplifier component 104 can be desirably (e.g., suitably, enhancedly, or optimally) varied or adjusted from a second minimum gain level (e.g., a second threshold minimum gain level) to a second maximum gain level (e.g., a second threshold maximum gain level) based at least in part on a second gain range associated with the second amplifier component 104. In certain embodiments, the second amplifier component 104 can have a single-ended input and a differential output (e.g., differential output port). In other embodiments, the second amplifier component 104 can have a differential input and/or a differential output.

In some embodiments, the third amplifier component 106 can be another VGA component (e.g., $VGA_1$) that can have an input (e.g., input port) that can be associated with (e.g., electrically or electronically connected to) the output (e.g., output port) of the second amplifier component 104. The third amplifier component 106 can receive the second voltage signal at its input, and can generate a third voltage signal at a third voltage level that can be based at least in part on a third gain level associated with the third amplifier component 106 (e.g., based at least in part on the third gain level applied to the second voltage signal). The third gain level of the third amplifier component 106 can be varied or adjusted, as desired, from a third minimum gain level to a third maximum gain level based at least in part on a third gain range associated with the third amplifier component 106. In certain embodiments, the third amplifier component 106 can have a differential input (e.g., differential input port) and a differential output (e.g., differential output port).

In certain embodiments, the fourth amplifier component 108 can be still another VGA component (e.g., $VGA_n$, wherein n can be a desired number) that can have an input that can be associated with (e.g., electrically or electronically connected to) the output of the third amplifier component 106, although in other embodiments, there may be one or more other amplifier components that can be situated between the third amplifier component 106 and the fourth amplifier component 108 in the electronic circuitry of the system 100, wherein, in such other embodiments, the output of the third amplifier component 106 can be associated with an input of another amplifier component that can be adjacent to the third amplifier component 106, and wherein the input of the fourth amplifier component 108 can be associated with the output of another amplifier component that can be adjacent to the fourth amplifier component 108. In some embodiments, the fourth amplifier component 108 (e.g., when n=2, and it is $VGA_2$) can receive the third voltage signal at its input, and can generate a fourth voltage signal at a fourth voltage level that can be based at least in part on a fourth gain level associated with the fourth amplifier component 108 (e.g., based at least in part on the fourth gain level applied to the third voltage signal). The fourth gain level of the fourth amplifier component 108 can be varied or adjusted, as desired, from a fourth minimum gain level to a fourth maximum gain level based at least in part on a fourth gain range associated with the fourth amplifier component 108. In certain embodiments, the fourth amplifier component 108 can have a differential input and a differential output. It is to be appreciated and understood that, in some embodiments, the system 100 can contain less than four amplifier components, if desired.

In some embodiments, the system 100 can comprise a buffer component (BUFFER COMP) 112 that can receive the fourth voltage signal from the fourth amplifier component 108 (e.g., at an input port of the buffer component 112), and can generate or provide an output signal 114 (e.g., output voltage signal) as an output from the buffer component 112 (e.g., from an output port of the buffer component 112) that can be based at least in part on the fourth voltage signal (e.g., the output voltage level of the output signal can be, or can be a function of, the fourth voltage level of the fourth voltage signal). The output signal 114 also can be based at least in part on (e.g., can be a function of) the input current signal input to the first amplifier component 102. The output signal 114 can be provided to another desired component or system, can be provided to an AGC component 116 (e.g., as part of an AGC or feedback loop), and/or can otherwise be utilized, as desired.

In accordance with various embodiments, the AGC component 116 can control (e.g., automatically control, manage, or adjust) respective gain levels (e.g., the first gain level, second gain level, third gain level, fourth gain level, and/or one or more other gain levels) respectively associated with the respective amplifier components (e.g., first amplifier component 102, second amplifier component 104, third amplifier component 106, fourth amplifier component 108, and/or one or more other amplifier components) of the group of amplifier components, based at least in part on a result of analyzing the output signal 114 (e.g., an output swing or other characteristics of the output signal 114). The AGC component 116 can determine characteristics of the output signal 114 based at least in part on the result of analyzing the output signal 114. In some embodiments, the AGC component 116 can control the respective gain levels of the respective amplifier components (e.g., 102, 104, 106, and/or 108) of the group of amplifier components, based at least in part on the characteristics of the output signal 114, in accordance with an amplifier gain adjustment sequence that can indicate or specify respective (e.g., individual) gain level adjustments (e.g., partial gain level reductions or increases) that can be made to the respective amplifier components under respective conditions associated with the output signal 114, the respective amplifier components, and/or the system 100 overall. For instance, the amplifier gain adjustment sequence can facilitate reducing the overall gain level associated with the group of amplifier components, by individual adjustment (e.g., reductions) of individual gain levels of individual amplifier components (e.g., 102, 104, 106, and/or 108), in response to the output signal 114 indicating that the input current signal is increasing or has increased in power. The amplifier gain adjustment sequence also can facilitate increasing the overall gain level associated with the group of amplifier components, by individual adjustment (e.g., increases) of individual gain levels of individual amplifier components (e.g., 102, 104, 106, and/or 108), in response to the output signal 114 indicating that the input current signal is decreasing or has decreased in power.

In some embodiments, the AGC component 116 can analyze the output signal 114 (e.g., in relation or comparison to a reference signal), and, based at least in part on a result of analyzing the output signal 114, the AGC component 116 can determine characteristics of the output signal 114 (e.g., an amount of output voltage swing of the output signal 114, peak voltage value, received signal strength indicator (RSSI), or other characteristics of the output signal 114). The AGC component 116 can determine a state value (e.g., an AGC state value) associated with the AGC component 116, based at least in part on the characteristics of the output signal 114, wherein the state value can be associated with (e.g., indicative or representative of) a state (e.g., an AGC state) associated with the AGC component 116. The AGC component 116 can determine whether to adjust (e.g., increase or reduce) a gain level of an amplifier component (e.g., 102, 104, 106, or 108) of the group of amplifier components, and, if there is to be a gain level adjustment, which of the amplifier components (e.g., 102, 104, 106, or 108) is to have its gain level adjusted (e.g., partially adjusted), based at least in part on the state value and the amplifier gain adjustment sequence. In certain embodiments, the amplifier gain adjustment sequence can map or associate respective gain level adjustments to be applied to respective amplifier components (e.g., 102, 104, 106, and/or 108) to or with respective state values and/or respective states associated with the AGC component 116.

In certain embodiments, in the AGC circuitry of the AGC component 116, the AGC component 116 can comprise a peak detector whose function can be to detect the output swing of the output signal 114 that is output from the buffer component 112 (e.g., the output buffer). The output signal 114 can vary between a maximum and minimum voltage level. The difference between the maximum voltage level and the minimum voltage level can be defined as the swing of the output signal 114. The AGC component 116 can receive the output signal 114 or other signal information from the buffer component 112, and can analyze or process the output signal 114 or other signal information to determine or derive the characteristics associated with the output signal 114, including a peak voltage value or average voltage value of the output signal 114 (e.g., based at least in part on a peak envelope signal), the output voltage swing of the output signal 114, and/or other characteristics of the output signal 114. For instance, with regard to output voltage swing, the AGC component 116 can compare the peak voltage value to a reference voltage value of the reference signal to determine whether the output signal 114 is above, at, or below a desired (e.g., target, wanted, necessary, or optimal) magnitude, based at least in part on a result of the comparison of the peak voltage value to the reference voltage value, and/or based at least in part on another desired factor.

If, based at least in part on analysis of the output signal 114, the AGC component 116 determines that the output swing of the output signal 114 from the buffer component 112 is larger than a target output swing (e.g., from the reference signal), the AGC component 116 can reduce or facilitate reducing the gain (e.g., the overall gain) of the group of amplifier components (e.g., 102, 104, 106, and/or 108) by increasing the state (and accordingly, the state value) associated with the AGC component 116. If, instead, based at least in part on analysis of the output signal 114, the AGC component 116 determines that the output swing of the output signal 114 is smaller or lower than the target output swing, the AGC component 116 can increase or facilitate increasing the gain by reducing the state (and accordingly, the state value) associated with the AGC component 116. In some embodiments, state values (e.g., AGC state values) associated with respective states can range from 0 to 2016, where a state value=0 can result in maximum gain of the group of amplifier components and a state value=2016 can result in minimum gain of the group of amplifier components. In other embodiments, the range of state values can have a different range than 0 to 2016. The state value associated with the AGC component 116 can be an indicator or a proxy (e.g., rough proxy) for the incoming input power of the input signal that is input to the group of amplifier components, as, for example, a state value=0 can indicate that there is very low or small input power, and a state value=2016 can indicate that there is very high or large input power. The AGC component 116 can utilize the target output swing as a reference (e.g., reference signal), and the target output swing can be defined through one or more register components (e.g., registers). For instance, the AGC component 116 can compare the output signal 114 to the target output signal to facilitate determining the state value and/or determining gain level adjustments for the group of amplifier components. The target output swing can be changed or set (e.g., dynamically changed or set) by a user, or by the system 100, another system, or device, at the time of manufacture or other desired time.

In response to receiving the output signal 114 (e.g., at a particular time), the AGC component 116 can determine a state (and corresponding state value) that the AGC component 116 is in or is to be in at the particular time based at least in part on the result of analyzing the output signal 114 (e.g., an output voltage swing or other characteristic of the output voltage signal 114) at the particular time. For instance, the AGC component 116 can determine a state and/or a corresponding state value (e.g., an AGC state value) the AGC component 116 is in or is to be in at the particular time based at least in part on the result of analyzing the output signal 114.

The AGC component 116 can control the respective gain levels associated with the respective amplifier components (e.g., 102, 104, 106, and/or 108) based at least in part on the state (e.g., AGC state) or state value associated with the AGC component 116 at that particular time. For instance, if the state value representative of the state is a relatively lower value, which can be indicative of or can correlate to a relatively lower amount of input power of the input signal to the first amplifier component (e.g., input current signal to the TIA amplifier component), the AGC component 116 typically can control and/or adjust one or more respective gain levels of one or more of the respective amplifier components (e.g., 102, 104, 106, and/or 108) to have the one or more respective gain levels be relatively higher, which can facilitate higher gain. If, instead, the state value representative of the state is a relatively higher value, which can be indicative of or can correlate to a relatively higher amount of input power of the input signal to the first amplifier component 102, the AGC component 116 typically can control and/or adjust one or more respective gain levels of one or more of the respective amplifier components (e.g., 102, 104, 106, and/or 108) to have the one or more respective gain levels be relatively lower, which can facilitate lower gain. To facilitate adjustment of a gain level(s) associated with the group of amplifier components, the AGC component 116 can generate a control signal(s), and can provide the control signal(s) to the desired amplifier component(s) (e.g., 102, 104, 106, and/or 108) to facilitate adjusting (e.g., increasing or decreasing) the gain level(s) of the desired amplifier component(s).

In accordance with various embodiments, the system 100 also can comprise amplifier regulator components that can be associated with (e.g., electrically connected to), and can regulate supply voltages supplied to, the amplifier components (e.g., 102, 104, 106, and/or 108). For instance, there can be a first amplifier regulator component 118 (e.g., TIA regulator component) that can be associated with the first amplifier component 102 (e.g., TIA component), and a second amplifier regulator component 120 (e.g., VGA regulator component) that can be associated with the second, third, and/or fourth amplifier components 104, 106, and/or 108 (e.g., VGA components). The first amplifier regulator component 118 and the second amplifier regulator component 120 also can be associated with (e.g., electrically connected to) the AGC component 116 and can receive state information, comprising the state value indicative or representative of the AGC state, from the AGC component 116 on a desired time basis (e.g., regularly, constantly or substantially constantly, periodically, or dynamically or aperiodically).

In some embodiments, the first amplifier regulator component 118 can comprise a first supply voltage controller component 122 that can control (e.g., adjust, modify, or maintain) a supply voltage level of a supply voltage that can be supplied by the first amplifier regulator component 118 to the first amplifier component 102, based at least in part on the state information, comprising the state value. The second amplifier regulator component 120 can comprise a second supply voltage controller component 124 that can control respective supply voltage levels of respective supply voltages that can be supplied to the second, third, and/or fourth amplifier components 104, 106, and/or 108, based at least in part on the state information, comprising the state value.

For example, the first supply voltage controller component 122 can determine a desired (e.g., suitable, wanted, target, or optimal) supply voltage level for the supply voltage to be supplied to the first amplifier component 102 based at least in part on the state information (e.g., the AGC state value or associated AGC state), a threshold (e.g., a first threshold) state value associated with a threshold (e.g., a first threshold) supply voltage level, and a first function or first mapping that can indicate or specify respective supply voltage levels that the first supply voltage controller component 122 can supply to the first amplifier component 102 by in relation to (e.g., as a function of) respective state values. Over a portion of the state value range (e.g., over a middle portion or region of state values), the first function or first mapping relating to respective supply voltage levels can comprise a range of supply voltage levels that can span and/or decrease from the threshold (e.g., first threshold) supply voltage level (e.g., a higher supply voltage level, such as 2.70 volts (V) or other desired voltage level) to a second threshold supply voltage level (e.g., a lower supply voltage level, such as 2.23 V or other desired voltage level), for example, as the state value increases. For instance, in this middle region of state values, the supply voltage level can decrease from the first threshold supply voltage level to the second threshold supply voltage level as the state value increases, in accordance with a first slope, a first curve, or the first function that can be linear or non-linear, as desired.

In certain embodiments, for a first subgroup of state values (e.g., AGC state values ranging from 0 to 503) that do not satisfy (e.g., that are below) the first threshold state value (e.g., AGC state value of 504), which can be a significant portion of the state value range, the first supply voltage controller component 122 can control (e.g., adjust or maintain) the supply voltage supplied to the first amplifier component 102 to have the supply voltage be at the first threshold supply voltage level (e.g., a highest or higher threshold supply voltage level with respect to the TIA amplifier component), in accordance with the first function or first mapping.

For a third subgroup of state values (e.g., AGC state values ranging from 1008 to 2016), which can be another significant portion of the state value range, the first supply voltage controller component 122 can control (e.g., adjust or maintain) the supply voltage supplied to the first amplifier component 102 to have the supply voltage be at the second threshold supply voltage level (e.g., a lowest or lower threshold supply voltage level with respect to the TIA amplifier component), in accordance with the first function or first mapping. In some embodiments, the AGC state value (e.g., AGC state value of 1008) at the beginning (e.g., lower value end) of the third subgroup of state values can be a second threshold state value that can be associated with (e.g., mapped or linked to) the second threshold supply voltage level.

With regard to a second subgroup of state values (e.g., state values ranging from 504 to 1007), the first supply voltage controller component 122 can control (e.g., adjust or maintain) the supply voltage supplied to the first amplifier component 102 to have the supply voltage be at a supply voltage level that can be in between the first threshold supply voltage level and the second threshold supply voltage level, in accordance with the first function or first mapping.

For instance, with regard to the second subgroup of state values, if and as the state value increases from a relatively lower state value (e.g., state value of 505 or other relatively lower state value) of the second subgroup of state values to or towards a relatively higher state value (e.g., state value of 1007 or other relatively higher state value) of the second subgroup of state values, the first supply voltage controller component 122 can control the supply voltage supplied to the first amplifier component 102 to have the supply voltage level decrease towards (but be above) the second threshold supply voltage level, in accordance with the first function or first mapping. If and as the state value decreases from a relatively higher state value (e.g., state value of 1007 or other relatively higher state value) of the second subgroup of state values to or towards a relatively lower state value (e.g., state value of 505 or other relatively lower state value) of the second subgroup of state values, the first supply voltage controller component 122 can control the supply voltage supplied to the first amplifier component 102 to have the supply voltage level increase towards (but be below) the first threshold supply voltage level, in accordance with the first function or first mapping.

In accordance with various embodiments, the first supply voltage controller component 122 can determine the supply voltage level of the supply voltage to be supplied to the first amplifier component 102, based at least in part on the AGC state value determined or derived from (e.g., based at least in part on) the state information (e.g., received from the AGC component 116) or the output signal 114, the AGC state associated with the AGC state value, or one or more characteristics determined for the output signal 114, in accordance with the first function or first mapping. For example, with regard to the second subgroup of state values, the first supply voltage controller component 122 can determine the supply voltage level of the supply voltage to be supplied to the first amplifier component 102, based at least in part on respective portions of state values associated with the second subgroup of state values, in accordance with the first function or first mapping, such that for all AGC state values associated with a particular portion of state values, the supply voltage level can be the same (e.g., a first supply voltage level can be associated with a first portion of state values of the second subgroup of state values, a second supply voltage level can be associated with a second portion of state values of the second subgroup of state values, or another supply voltage level can be associated with another portion of state values of the second subgroup of state values). As another example, with regard to the second subgroup of state values, the first supply voltage controller component 122 can determine the supply voltage level of the supply voltage to be supplied to the first amplifier component 102, based at least in part on the AGC state value determined or derived from the output signal 114, in accordance with the first function or first mapping, such that, even with regard to AGC state values, the supply voltage level can be different for different AGC state values. Thus, the first function or first mapping of supply voltage levels in relation to AGC state values or AGC states can be as granular as desired.

As a non-limiting example, TABLE 1 can provide example respective supply voltage levels or supply voltage adjustments (e.g., reductions or decreases; or increases) for the first amplifier component 102 as a function of respective AGC state values, in accordance with an example first function or first mapping. In this example, the first amplifier component 102 can be a TIA. In this example, the AGC state values can range from 0 to 2016, and the supply voltage level provided to the first amplifier component 102 by the first amplifier regulator component 118 can range from a first threshold supply voltage level (e.g., 2.7 V) down to a second threshold supply voltage level (e.g., 2.23 V).

TABLE 1

Example Supply Voltage Adjustments for First Amplifier Component as a Function of AGC State Value

| AGC State Value | Supply Voltage Level (SVL) (for TIA Regulator Voltage) |
|---|---|
| 0 | 1st threshold SVL (e.g., adjust/set SVL to 2.700 V) |
| 1 | 1st threshold SVL (e.g., adjust/set SVL to 2.700 V) |
| 2 | 1st threshold SVL (e.g., adjust/set SVL to 2.700 V) |
| . . . | 1st threshold SVL (e.g., adjust/set SVL to 2.700 V) |
| 502 | 1st threshold SVL (e.g., adjust/set SVL to 2.700 V) |
| 503 | 1st threshold SVL (e.g., adjust/set SVL to 2.700 V) |
| 504 | Adjust/set SVL to first SVL (e.g., adjust/set to 2.699 V) |
| 505 | Adjust/set SVL to second SVL (e.g., adjust/set to 2.698 V) |
| 506 | Adjust/set SVL to third SVL (e.g., adjust/set to 2.697 V) |
| . . . | (continue adjustments/setting of SVL as state value changes) |
| 1005 | Adjust/set SVL to another SVL (e.g., adjust/set SVL to 2.233 V) |
| 1006 | Adjust/set SVL to still another SVL (e.g., adjust/set SVL to 2.232 V) |
| 1007 | Adjust/set SVL to yet another SVL (e.g., adjust/set SVL to 2.231 V) |
| 1008 | 2nd threshold supply voltage level (e.g., adjust/set SVL to 2.230 V) |
| 1009 | 2nd threshold supply voltage level (e.g., adjust/set SVL to 2.230 V) |
| 1010 | 2nd threshold supply voltage level (e.g., adjust/set SVL to 2.230 V) |
| . . . | 2nd threshold supply voltage level (e.g., adjust/set SVL to 2.230 V) |
| 2015 | 2nd threshold supply voltage level (e.g., adjust/set SVL to 2.230 V) |
| 2016 | 2nd threshold supply voltage level (e.g., adjust/set SVL to 2.230 V) |

Generally, as the AGC state value increases, and accordingly, the AGC state increases, this can indicate that the input power of the input signal can be increasing; and conversely, as the AGC state value decreases, and accordingly, the AGC state decreases, this can indicate that the input power of the input signal can be decreasing. Per TABLE 1, if and as the AGC state value increases (e.g., in the range of 0 to 503), but where the AGC state value is not above 503, or the AGC state value (e.g., even if decreasing) is otherwise in the first subgroup of state values (e.g., in the range of 0 to 503), the first supply voltage controller component 122 can determine that the supply voltage level of the supply voltage to be supplied to the first amplifier component 102 is to be maintained at or adjusted to the first threshold supply voltage level, based at least in part on the AGC state value and/or the associated AGC state, in accordance with the example first function or first mapping. The first threshold supply voltage level can be associated with the first subgroup of AGC state values (e.g., 0 to 503). Per TABLE 1, if and as the AGC state value increases (e.g., in the range of 1008 to 2016), and accordingly, the AGC state increases, or the AGC state value (e.g., even if decreasing) is otherwise in the third subgroup of state values (e.g., in the range of 1008 to 2016), where the AGC state value is not below 1008, the first supply voltage controller component 122 can determine that the supply voltage level of the supply voltage to be supplied to the first amplifier component 102 is to be maintained at or adjusted to the second threshold supply voltage level, based at least in part on such AGC state value and/or associated AGC state, in accordance with the example first function or first mapping. The second threshold supply voltage level can be associated with the third subgroup of AGC state values (e.g., 1008 to 2016).

Per TABLE 1, if and as the AGC state value increases (e.g., in the range of 504 to 1007), and accordingly, the AGC state increases, but where the AGC state value is not above 1007, or the AGC state value (e.g., even if decreasing) is otherwise in the second subgroup of state values (e.g., in the range of 504 to 1007), the first supply voltage controller component 122 can determine that the supply voltage level of the supply voltage to be supplied to the first amplifier component 102 is to be maintained at or adjusted to the supply voltage level that can be between the first threshold supply voltage level and the second threshold supply voltage level, based at least in part on the AGC state value and/or the associated AGC state, in accordance with the example first function or first mapping. The respective supply voltage levels between the first threshold supply voltage level and the second threshold supply voltage level can be associated with respective AGC state values of the second subgroup of AGC state values (e.g., 504 to 1007). For example, if the AGC state value is determined to be 505, the first supply voltage controller component 122 can determine that the supply voltage level of the supply voltage to be supplied to the first amplifier component 102 is to be maintained at or adjusted to 2.698 V, in accordance with the example first function or first mapping represented in example TABLE 1. As another example, if the AGC state value is determined to be 1006, the first supply voltage controller component 122 can determine that the supply voltage level of the supply voltage to be supplied to the first amplifier component 102 is to be maintained at or adjusted to 2.232 V, in accordance with the example first function or first mapping represented in example TABLE 1.

It is to be appreciated and understood that the example respective supply voltage adjustments (e.g., reductions or decreases; or increases) for the first amplifier component 102 as a function of respective AGC state values and/or associated respective AGC states, in accordance with an example first function or first mapping, that are exemplified in TABLE 1 are but one example respective supply voltage adjustments that can be employed for the first amplifier component 102 and executed by the first supply voltage controller component 122 and/or associated first amplifier regulator component 118. It is to be appreciated and understood that, in accordance with other embodiments, the first supply voltage controller component 122 and/or associated first amplifier regulator component 118 can employ different respective supply voltage adjustments (e.g., reductions or decreases; or increases) for the first amplifier component 102 as a function of respective AGC state values and/or associated respective AGC states, in accordance with a different first function or first mapping associated with the first amplifier component than exemplified in TABLE 1, if and as desired, including, but not limited to, other non-limiting example supply voltage adjustments (e.g., reductions or decreases; or increases) for the first amplifier component 102 as described herein.

Also, in accordance with various embodiments, with regard to the first amplifier component 102, first supply voltage controller component 122, and/or first amplifier regulator component 118, the number of AGC state values (and associated AGC states), the respective threshold AGC state values or respective subgroups of AGC state values, the first threshold supply voltage level, the second threshold supply voltage level, the granularity of adjustments of the supply voltage level, the number of adjustments of the supply voltage level between the first and second threshold supply voltage levels, and/or other characteristics or parameters relating to supply voltage level adjustments associated with the first amplifier component 102 can be structured, selected, modified (e.g., changed or adjusted), or utilized to create (e.g., generate) a desired first function or first mapping relating to supply voltage level adjustments associated with the first amplifier component 102, which can be implemented or executed by the first supply voltage controller component 122 and/or first amplifier regulator component 118 (e.g., in conjunction or coordination with the AGC component 116). Also, if and as desired, the first function or first mapping relating to supply voltage level adjustments associated with the first amplifier component 102 can be updated (e.g., modified, adjusted, or changed) to generate an updated first function or first mapping relating to supply voltage level adjustments associated with the first amplifier component 102. For example, if and as desired, with regard to the first function or first mapping, a threshold AGC state value associated with a threshold supply voltage level can be modified to make the threshold AGC state value higher or lower (e.g., to achieve improved or increased performance of the first amplifier component 102, another component, and/or the system 100 overall), and/or one or more other parameters (e.g., a voltage level of a threshold supply voltage level) can be modified (e.g., increased or decreased), to create an updated first function or first mapping. In certain embodiments, such modifications to the first function or first mapping, and/or associated parameters, can be performed in hardware (e.g., by changing parameter settings or values in hardware registers, hardware logic, or other hardware components of the system 100).

In some embodiments, the first supply voltage controller component 122, first amplifier regulator component 118, and/or other component of the system 100 can comprise or be associated with logic, components, and circuitry (e.g., hardware logic, components, and circuitry) that can be representative of and/or can implement the desired first function or first mapping relating to supply voltage level adjustments associated with the first amplifier component 102 in relation to (e.g., as a function of) respective AGC state values and/or AGC states. Values in a table, such as TABLE 1 or other table, representative of the desired first function or first mapping and/or other desired values (e.g., threshold values, system settings, or other values) relating to supply voltage level adjustments associated with the first amplifier component 102 can be stored in register components, storage locations, or other memory that can be associated with the first supply voltage controller component 122, first amplifier regulator component 118, and/or other component of the system 100.

In certain embodiments, as disclosed, with regard to the second subgroup of state values (e.g., AGC state values ranging from 504 to 1007, or other desired range of AGC state values), if and as desired, adjustments to a supply voltage level of the supply voltage to be supplied to the first amplifier component 102 by the first amplifier regulator component 118 can be relatively less granular such that a first supply voltage level can be associated with a first portion of state values (e.g., AGC state values ranging from 504 through 566) of the second subgroup of state values, a second supply voltage level can be associated with a second portion of state values (e.g., AGC state values ranging from 567 through 629) of the second subgroup of state values, or another supply voltage level can be associated with another portion of state values (e.g., AGC state values ranging from 630 through 692) of the second subgroup of state values. Is this example embodiment, a first transition point between the first portion of state values and the second portion of state values can be a first threshold transition AGC state value (e.g., 567), and a second transition point between the second portion of state values and the third portion of state values can be a second threshold transition AGC state value (e.g., 630). If the state value was in the first portion of state values and increases beyond the first threshold transition AGC state value to a state value in the second portion of the state values, the first supply voltage controller component 122 can decrease the supply voltage from the first supply voltage level associated with the first portion of the state values to the second supply voltage level associated with the second portion of the state values. In some embodiments, with regard to decreasing AGC state values, the same threshold transition AGC state values (e.g., first threshold transition AGC state value, second threshold transition AGC state value, or other threshold transition AGC state value) that can be used to determine whether to decrease the supply voltage level as the AGC state value increases also can be utilized by the first supply voltage controller component 122 to determine whether to increase the supply voltage level supplied to the first amplifier component 102 as the AGC state value decreases. Accordingly, if the state value was in the second portion of state values and decreases below the first threshold transition AGC state value to a state value in the first portion of the state values, the first supply voltage controller component 122 can increase the supply voltage from the second supply voltage level associated with the second portion of the state values to the first supply voltage level associated with the first portion of the state values.

In certain other embodiments, if and as desired, with regard to the second subgroup of AGC state values (e.g., AGC state values ranging from 504 to 1007, or other desired range of AGC state values), the threshold transition AGC state values utilized by the AGC component 116, first supply voltage controller component 122, and/or first amplifier regulator component 118 to determine whether to increase the supply voltage level supplied to the first amplifier component 102 as the AGC state value decreases (e.g., across different portions of the second subgroup of AGC state values) can be different from threshold transition AGC state values utilized by the first supply voltage controller component 122 to determine whether to decrease the supply voltage level supplied to the first amplifier component 102 as the AGC state value increases (e.g., across different portions of the second subgroup of AGC state values). For example, with regard to decreases in AGC state values, instead of utilizing a threshold transition AGC state value of 567 as the first transition point for increasing the supply voltage from the second supply voltage level to the first supply voltage level as the AGC state value decreases from being above 567 to below 567, the first supply voltage controller component 122 can utilize a threshold transition AGC state value of 535 (or other desired AGC state value less than 567 and greater than 504) as a threshold or transition point for determining whether to increase the supply voltage level that is supplied to the first amplifier component 102 by the first amplifier regulator component 118 from the second supply voltage level to the first supply voltage level as the AGC state value decreases.

With further regard to the second supply voltage controller component 124 and associated second amplifier regulator component 120, in a manner similar to (e.g., but, in some embodiments, inverse or substantially inverse to) determining supply voltage levels to supply to the first amplifier component 102, the second supply voltage controller component 124 can determine a desired supply voltage level for the supply voltage to be supplied to the second, third, and/or fourth amplifier components (e.g., 104, 106, and/or 108) based at least in part on the state information (e.g., the AGC state value or associated AGC state), the first threshold state value (e.g., first threshold AGC state value) associated with a second threshold supply voltage level, and a second function or second mapping relating to respective supply voltage levels in relation to (e.g., as a function of) respective state values. The threshold state value utilized by the second supply voltage controller component 124 in connection with supply voltage level adjustments associated with the second, third, and/or fourth amplifier components 104, 106, and/or 108 can be same as or different from the threshold state value utilized by the first supply voltage controller component 122 in connection with supply voltage level adjustments associated with the first amplifier component 102. The second threshold supply voltage level employed by the second supply voltage controller component 124 can be same as or different from the second threshold supply voltage level associated with the first function or first mapping employed by the first supply voltage controller component 122. In some embodiments, the second function or second mapping utilized by the second supply voltage controller component 124 to facilitate determining supply voltage level adjustments for the supply voltage supplied to the second, third, and/or fourth amplifier components 104, 106, and/or 108 can be different from the first function or first mapping utilized by the first supply voltage controller component 122.

In certain embodiments, for a first subgroup of state values (e.g., state values ranging from 0 to 503) that do not satisfy (e.g., that are below) the first threshold state value (e.g., state value of 504), the second supply voltage controller component 124 can determine that the supply voltage supplied to the second, third, and/or fourth amplifier components 104, 106, and/or 108 is to be at the second threshold supply voltage level (e.g., a lowest or lower threshold supply voltage level with respect to the VGA amplifier component (s)) and can control such supply voltage to be at the second threshold supply voltage level, in accordance with the second function or second mapping.

For a third subgroup of state values (e.g., state values ranging from 1008 to 2016), the second supply voltage controller component 124 can determine that the supply voltage supplied to the second, third, and/or fourth amplifier components 104, 106, and/or 108 is to be at the first threshold supply voltage level (e.g., a highest or higher threshold supply voltage level with respect to the VGA amplifier component(s)) and can control such supply voltage to be at the first threshold supply voltage level, in accordance with the second function or second mapping. In some embodiments, the second supply voltage controller component 124 can employ a second threshold state value (e.g., state value of 1008), and the state values of the third subgroup of state values can be determined to satisfy (e.g., can be at or above) the second threshold state value.

With regard to a second subgroup of state values (e.g., state values ranging from 504 to 1007), the second supply voltage controller component 124 can determine that the supply voltage supplied to the second, third, and/or fourth amplifier components 104, 106, and/or 108 is to be at a supply voltage level that can be in between the second threshold supply voltage level and the first threshold supply voltage level, and can control such supply voltage to be at a supply voltage level that is in between the second threshold supply voltage level and the first threshold supply voltage level, in accordance with the second function or second mapping. With regard to state values and/or AGC states associated with the second subgroup of AGC states, as the state value and/or AGC state increases, the supply voltage level supplied to the second, third, and/or fourth amplifier components 104, 106, and/or 108 by the second amplifier regulator component 120 can increase from the second threshold supply voltage level to a relatively higher voltage supply level that can be above the second threshold supply voltage level, but below the first threshold supply voltage level, in accordance with the second function or second mapping. As with the first function or first mapping associated with the first supply voltage controller component 122, the second function or second mapping of supply voltage levels in relation to AGC state values or AGC states associated with the second supply voltage controller component 124 can be as granular as desired.

As a non-limiting example, TABLE 2 can provide example respective supply voltage adjustments (e.g., reductions or decreases; or increases) for the second, third, and/or fourth amplifier components 104, 106, and/or 108 as a function of respective AGC state values and/or associated respective AGC states, in accordance with an example second function or second mapping. In this example, the second, third, and/or fourth amplifier components 104, 106, and/or 108 can be VGAs (e.g., $VGA_0$, $VGA_1$, and/or $VGA_n$). In this example, the AGC state values can range from 0 to 2016, and the supply voltage level provided to the second, third, and/or fourth amplifier components 104, 106, and/or 108 by the second amplifier regulator component 120 can range from a second threshold supply voltage level (e.g., 2.23 V) up to a first threshold supply voltage level (e.g., 2.70 V), such as described herein.

TABLE 2

Example Supply Voltage Adjustments for Second, Third, and/or Fourth Amplifier Components as a Function of AGC State Value

| AGC State Value | Supply Voltage Level (SVL) (for VGA Regulator Voltage) |
|---|---|
| 0 | 1st threshold SVL (e.g., adjust/set SVL to 2.230 V) |
| 1 | 1st threshold SVL (e.g., adjust/set SVL to 2.230 V) |
| 2 | 1st threshold SVL (e.g., adjust/set SVL to 2.230 V) |
| . . . | 1st threshold SVL (e.g., adjust/set SVL to 2.230 V) |
| 502 | 1st threshold SVL (e.g., adjust/set SVL to 2.230 V) |
| 503 | 1st threshold SVL (e.g., adjust/set SVL to 2.230 V) |
| 504 | Adjust/set SVL to first SVL (e.g., adjust/set to 2.231 V) |
| 505 | Adjust/set SVL to second SVL (e.g., adjust/set to 2.232 V) |
| 506 | Adjust/set SVL to third SVL (e.g., adjust/set to 2.233 V) |
| . . . | (continue adjustments/setting of SVL as state value changes) |
| 1005 | Adjust/set SVL to another SVL (e.g., adjust/set SVL to 2.267 V) |
| 1006 | Adjust/set SVL to still another SVL (e.g., adjust/set SVL to 2.268 V) |
| 1007 | Adjust/set SVL to yet another SVL (e.g., adjust/set SVL to 2.269 V) |
| 1008 | 2nd threshold supply voltage level (e.g., adjust/set SVL to 2.700 V) |
| 1009 | 2nd threshold supply voltage level (e.g., adjust/set SVL to 2.700 V) |
| 1010 | 2nd threshold supply voltage level (e.g., adjust/set SVL to 2.700 V) |
| . . . | 2nd threshold supply voltage level (e.g., adjust/set SVL to 2.700 V) |
| 2015 | 2nd threshold supply voltage level (e.g., adjust/set SVL to 2.700 V) |
| 2016 | 2nd threshold supply voltage level (e.g., adjust/set SVL to 2.700 V) |

Generally, as the AGC state value increases, and accordingly, the AGC state increases, this can indicate that the input power of the input signal can be increasing; and conversely, as the AGC state value decreases, and accordingly, the AGC state decreases, this can indicate that the input power of the input signal can be decreasing. Per TABLE 2, if and as the AGC state value increases (e.g., in the range of 0 to 503), but where the AGC state value is not above 503, or the AGC state value (e.g., even if decreasing) is otherwise in the first subgroup of state values (e.g., in the range of 0 to 503), the second supply voltage controller component 124 can determine that the supply voltage level of the supply voltage to be supplied to the second, third, and/or fourth amplifier components 104, 106, and/or 108 is to be maintained at or adjusted to the second (e.g., lowest or relatively lower) threshold supply voltage level (e.g., 2.23 V or other desired lowest or lower threshold supply voltage level), based at least in part on the AGC state value and/or the associated AGC state, in accordance with the example second function or second mapping. The second threshold supply voltage level can be associated with the first subgroup of AGC state values (e.g., 0 to 503). Per TABLE 2, if and as the AGC state value increases (e.g., in the range of 1008 to 2016), where the AGC state value is not below 1008, or the AGC state value (e.g., even if decreasing) is otherwise in the third subgroup of state values (e.g., in the range of 1008 to 2016), the second supply voltage controller component 124 can determine that the supply voltage level of the supply voltage to be supplied to the second, third, and/or fourth amplifier components 104, 106, and/or 108 is to be maintained at or adjusted to (e.g., modified) to the first (e.g., highest or relatively higher) threshold supply voltage level (e.g., 2.70 V or other desired highest or higher threshold supply voltage level), based at least in part on such AGC state value and/or associated AGC state, in accordance with the example second function or second mapping. The first threshold supply voltage level can be associated with the third subgroup of AGC state values (e.g., 1008 to 2016).

Per TABLE 2, if and as the AGC state value increases (e.g., in the range of 504 to 1007), but where the AGC state value is not above 1007, or the AGC state value (e.g., even if decreasing) is otherwise in the second subgroup of state values (e.g., in the range of 504 to 1007), the second supply voltage controller component 124 can determine that the supply voltage level of the supply voltage to be supplied to the second, third, and/or fourth amplifier components 104, 106, and/or 108 is to be maintained at or adjusted to the supply voltage level that can be between the second threshold supply voltage level and the first threshold supply voltage level, based at least in part on the AGC state value and/or the associated AGC state, in accordance with the example second function or second mapping. The respective supply voltage levels between the second threshold supply voltage level and the first threshold supply voltage level can be associated with respective AGC state values of the second subgroup of AGC state values (e.g., 504 to 1007). For example, if the AGC state value is determined to be 505, the second supply voltage controller component 124 can determine that the supply voltage level of the supply voltage to be supplied to the second, third, and/or fourth amplifier components 104, 106, and/or 108 is to be maintained at or adjusted to 2.232 V, in accordance with the example second function or second mapping represented in example TABLE 2. As another example, if the AGC state value is determined to be 1006, the second supply voltage controller component 124 can determine that the supply voltage level of the supply voltage to be supplied to the second, third, and/or fourth amplifier components 104, 106, and/or 108 is to be maintained at or adjusted to 2.268 V, in accordance with the example second function or second mapping represented in example TABLE 2.

It is to be appreciated and understood that the example respective supply voltage adjustments (e.g., increases; or reductions or decreases) for the second, third, and/or fourth amplifier components 104, 106, and/or 108 as a function of respective AGC state values and/or associated respective AGC states, in accordance with an example second function or second mapping, that are exemplified in TABLE 2 are but one example respective supply voltage adjustments that can be employed for the second, third, and/or fourth amplifier components 104, 106, and/or 108 and executed by the second supply voltage controller component 124 and/or associated second amplifier regulator component 120. It also is to be appreciated and understood that, in accordance with other embodiments, the second supply voltage controller component 124 and/or associated second amplifier regulator component 120 can employ different respective supply voltage adjustments (e.g., increases or reductions) for the second, third, and/or fourth amplifier components 104, 106, and/or 108 as a function of respective AGC state values and/or associated respective AGC states, in accordance with a different function or different mapping associated with the second, third, and/or fourth amplifier components 104, 106, and/or 108 than exemplified in TABLE 2, if and as desired, including, but not limited to, other non-limiting example supply voltage adjustments (e.g., increases; or reductions or decreases) for the second, third, and/or fourth amplifier components 104, 106, and/or 108, such as described herein. It further is to be appreciated and understood, that, in other embodiments, the second supply voltage controller component 124 and/or associated second amplifier regulator component 120 can utilize respective (e.g., different) functions or respective mappings that can indicate or specify respective supply voltage adjustments for the respective amplifier components (e.g., 104, 106, and/or 108) as a function of respective AGC state values and/or associated respective AGC states, such that there can be individual or respective supply voltage adjustments for the respective amplifier components (e.g., 104, 106, and/or 108).

Also, in accordance with various embodiments, with regard to the second, third, and/or fourth amplifier components 104, 106, and/or 108, second supply voltage controller component 124, and/or second amplifier regulator component 120, the number of AGC state values (and associated AGC states), the respective threshold AGC state values or respective subgroups of AGC state values, the first threshold supply voltage level, the second threshold supply voltage level, the granularity of adjustments of the supply voltage level, the number of adjustments of the supply voltage level between the first and second threshold supply voltage levels, and/or other characteristics or parameters relating to supply voltage level adjustments associated with the second, third, and/or fourth amplifier components 104, 106, and/or 108 can be structured, selected, modified (e.g., changed or adjusted), or utilized to create (e.g., generate) a desired second function or second mapping relating to supply voltage level adjustments associated with the second, third, and/or fourth amplifier components 104, 106, and/or 108, which can be implemented or executed by the second supply voltage controller component 124 and/or second amplifier regulator component 120 (e.g., in conjunction or coordination with the AGC component 116). Also, if and as desired, the second function or second mapping relating to supply voltage level adjustments associated with the second, third, and/or fourth amplifier components 104, 106, and/or 108 can be updated (e.g., modified, adjusted, or changed) to generate an updated second function or second mapping relating to supply voltage level adjustments associated with the second, third, and/or fourth amplifier components 104, 106, and/or 108. For example, if and as desired, with regard to the second function or second mapping, a threshold AGC state value associated with a threshold supply voltage level can be modified to make the threshold AGC state value higher or lower (e.g., to achieve improved or increased performance of the second, third, and/or fourth amplifier components 104, 106, and/or 108, another component, and/or the system 100 overall), and/or one or more other parameters (e.g., a voltage level of a threshold supply voltage level) can be modified (e.g., increased or decreased), to create an updated second function or second mapping. In some embodiments, such modifications to the second function or second mapping, and/or associated parameters, can be performed in hardware (e.g., by changing parameter settings or values in hardware registers, hardware logic, or other hardware components of the system 100).

In certain embodiments, the second supply voltage controller component 124, second amplifier regulator component 120, and/or other component of the system 100 can comprise or be associated with logic, components, and circuitry (e.g., hardware logic, components, and circuitry) that can be representative of and/or can implement the desired second function or second mapping relating to supply voltage level adjustments associated with the second, third, and/or fourth amplifier components 104, 106, and/or 108 in relation to (e.g., as a function of) respective AGC state values and/or AGC states. Values in a table, such as TABLE 2 or other table, representative of the desired second function or second mapping and/or other desired values (e.g., threshold values, system settings, or other values) relating to supply voltage level adjustments associated with the second, third, and/or fourth amplifier components 104, 106, and/or 108 can be stored in register components, storage locations, or other memory that can be associated with the second supply voltage controller component 124, second amplifier regulator component 120, and/or other component of the system 100.

In some embodiments, as disclosed, with regard to the second subgroup of state values (e.g., AGC state values ranging from 504 to 1007, or other desired range of AGC state values), if and as desired, adjustments to a supply voltage level of the supply voltage to be supplied to the second, third, and/or fourth amplifier components 104, 106, and/or 108 by the second amplifier regulator component 120 can be relatively less granular (e.g., as compared to the granularity represented in TABLE 2) such that, for example, a first supply voltage level can be associated with a first portion of state values (e.g., AGC state values ranging from 504 through 566) of the second subgroup of state values, a second supply voltage level can be associated with a second portion of state values (e.g., AGC state values ranging from 567 through 629) of the second subgroup of state values, or another supply voltage level can be associated with another portion of state values (e.g., AGC state values ranging from 630 through 692) of the second subgroup of state values. Is this example embodiment, a first transition point between the first portion of state values and the second portion of state values can be a first threshold transition AGC state value (e.g., 567), and a second transition point between the second portion of state values and the third portion of state values can be a second threshold transition AGC state value (e.g., 630). If the state value was in the first portion of state values and increases beyond the first threshold transition AGC state value to a state value in the second portion of the state values, the second supply voltage controller component 124 can increase the supply voltage from the first supply voltage level associated with the first portion of the state values to the second supply voltage level associated with the second portion of the state values. In certain embodiments, with regard to decreasing AGC state values, the same threshold transition AGC state values (e.g., first threshold transition AGC state value, second threshold transition AGC state value, or other threshold transition AGC state value) that can be used to determine whether to increase the supply voltage level as the AGC state value increases also can be utilized by the second supply voltage controller component 124 to determine whether to decrease the supply voltage level supplied to the second, third, and/or fourth amplifier components 104, 106, and/or 108 as the AGC state value decreases.

In certain other embodiments, if and as desired, with regard to the second subgroup of AGC state values (e.g., AGC state values ranging from 504 to 1007, or other desired range of AGC state values), the threshold transition AGC state values utilized by the AGC component 116, second supply voltage controller component 124, and/or second amplifier regulator component 120 to determine whether to decrease the supply voltage level supplied to the second, third, and/or fourth amplifier components 104, 106, and/or 108 as the AGC state value decreases (e.g., across different portions of the second subgroup of AGC state values) can be different from threshold transition AGC state values utilized by the second supply voltage controller component 124 to determine whether to increase the supply voltage level supplied to the second, third, and/or fourth amplifier components 104, 106, and/or 108 as the AGC state value increases (e.g., across different portions of the second subgroup of AGC state values), similar to as described herein with regard to the first supply voltage controller component 122. For example, in relation to a particular threshold transition AGC state value utilized as a threshold or transition point for determining whether to increase the supply voltage level supplied to the second, third, and/or fourth amplifier components 104, 106, and/or 108 from a lower supply voltage level to a higher supply voltage level as the AGC state value increases, the AGC component 116, second supply voltage controller component 124, and/or second amplifier regulator component 120 can utilize a different threshold transition AGC state value as a threshold or transition point for determining whether to decrease the supply voltage level supplied to the second, third, and/or fourth amplifier components 104, 106, and/or 108 from the higher supply voltage level to the lower supply voltage level as the AGC state value decreases, wherein the different threshold transition AGC state value can be offset or shifted (e.g., offset or shifted down by a desired amount) from the particular threshold transition AGC state value.

It is to be appreciated and understood that, while some embodiments of the disclosed subject matter describe, with regard to the second subgroup of AGC state values (e.g., AGC state values ranging from 504 to 1007, or other desired range of AGC state values), decreasing the supply voltage level of the supply voltage supplied to the first amplifier component 102 as the AGC state value increases, if and as desired, in other embodiments, the supply voltage level of the supply voltage supplied to the first amplifier component 102 can be increased as the AGC state value increases, and a mapping or function that can facilitate increasing such supply voltage level as the AGC state value increases can be created and implemented. It also is to be appreciated and understood that, while certain embodiments of the disclosed subject matter describe, with regard to the second subgroup of AGC state values, increasing the supply voltage level of the supply voltage supplied to the second, third, and/or fourth amplifier components 104, 106, and/or 108 as the AGC state value increases, if and as desired, in other embodiments, the supply voltage level of the supply voltage supplied to the second, third, and/or fourth amplifier components 104, 106, and/or 108 can be decreased as the AGC state value increases, and a mapping or function that can facilitate decreasing such supply voltage level as the AGC state value increases can be created and implemented.

Figure 2:
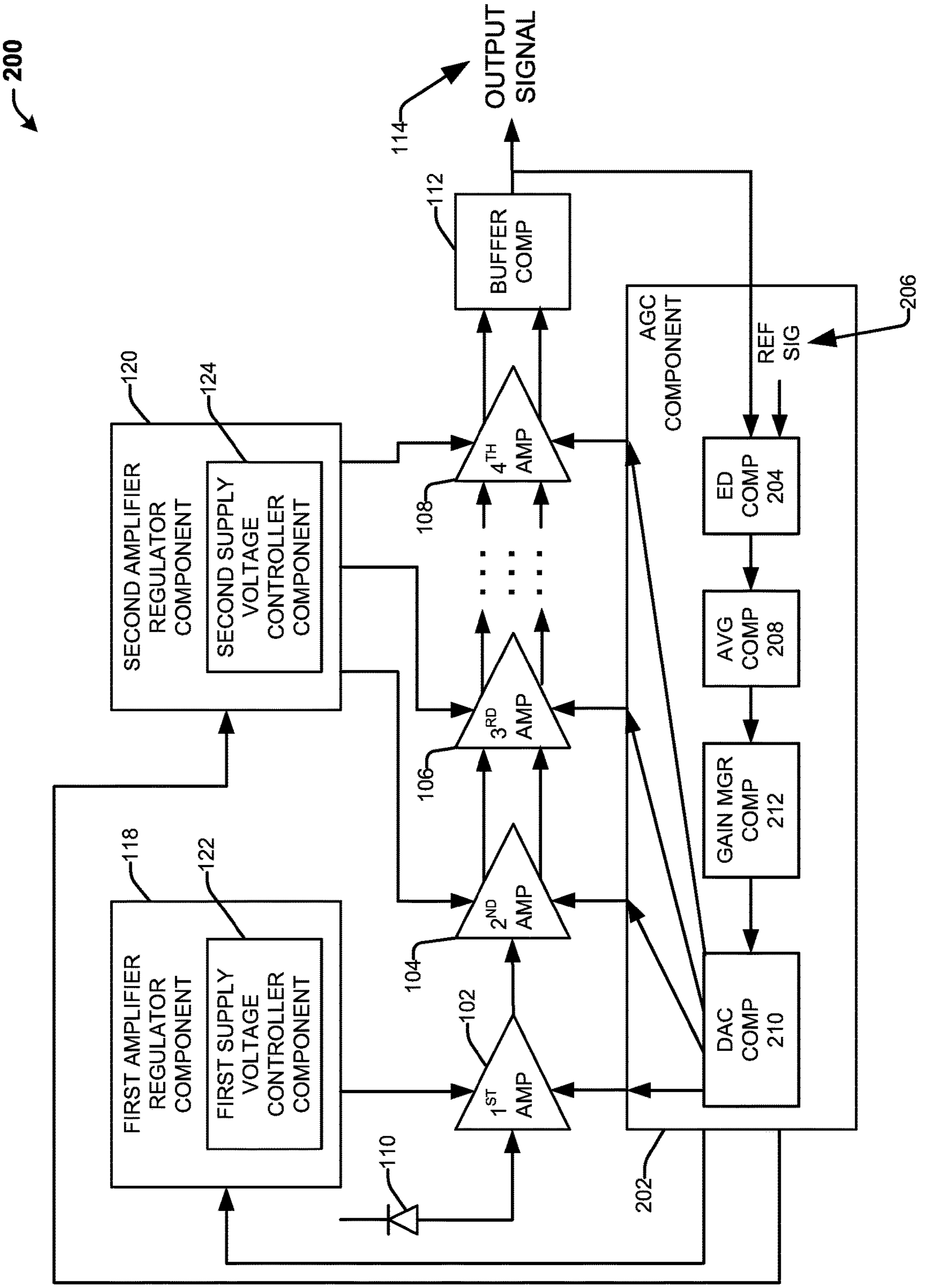
FIG. 2 depicts a block diagram of another non-limiting example system that can desirably control adjustments to supply voltage levels of supply voltages supplied by amplifier regulators to amplifier components, in accordance with various aspects and embodiments of the disclosed subject matter.

Referring to FIG. 2, FIG. 2 depicts a block diagram of another non-limiting example system 200 that can desirably (e.g., suitably, acceptably, enhancedly, or optimally) control adjustments to supply voltage levels of supply voltages supplied by amplifier regulators to amplifier components, in accordance with various aspects and embodiments of the disclosed subject matter. The system 200 can be part of, employed by, or associated with a device that can perform desired electrical or electronic functions.

The system 200 can comprise a group of amplifier components, which can include, for example, the first amplifier component 102, the second amplifier component 104, the third amplifier component 106, the fourth amplifier component 108, and/or one or more other amplifier components (not shown in FIG. 2 for reasons of brevity and clarity). In some embodiments, the system 200 also can comprise the diode 110 (e.g., photodiode) that can be associated with the input of the first amplifier component 102, wherein the diode can receive or detect a signal (e.g., optical signal) associated with the system 200, and can generate a current signal (e.g., input current signal) that can be received by the first amplifier component 102.

In some embodiments, the system 200 can comprise the buffer component 112 that can receive the fourth voltage signal from the fourth amplifier component 108, and can generate or provide the output signal 114 (e.g., output voltage signal) as an output from the buffer component 112 that can be based at least in part on the fourth voltage signal (e.g., the output voltage level of the output signal can be, or can be a function of, the fourth voltage level of the fourth voltage signal). The output signal 114 also can be based at least in part on (e.g., can be a function of) the input current signal input to the first amplifier component 102 and/or the respective gain levels associated with the respective amplifier components (e.g., 102, 104, 106, and/or 108). The output signal 114 can be provided to another desired component or system, can be provided to an AGC component 202 (e.g., as part of an AGC or feedback loop), and/or can otherwise be utilized, as desired.

In certain embodiments, the AGC component 202 can comprise an error detector component (ED COMP) 204 that can receive the output signal 114 that can be output from the buffer component 112. The error detector component 204 can compare the output signal 114 with a reference signal (REF SIG) 206, and can generate an error detection output signal (e.g., on a regular or continuous basis) based at least in part on the result of the comparison of the output signal 114 to the reference signal 206. For instance, the error detector component 204 can compare the output signal 114 with the reference signal 206, and can determine a difference between the output voltage level (e.g., peak voltage level or other determined or identified voltage level) of the output signal 114 and the reference voltage level of the reference signal 206, and can generate the error detection output signal as being equal to, or as a function of, the difference the output voltage level of the output signal 114 and the reference voltage level of the reference signal 206.

The AGC component 202 also can comprise an averaging component (AVG COMP) 208 that can comprise components and circuitry that can receive the error detection signals output from the error detector component 204, and can determine and generate an error voltage signal (e.g., error signal) that can be, or can be representative of, an average or median value, or other desired representative value or level, of the error detection signals (e.g., a portion of the error detection signals being evaluated by the averaging component 208). In some embodiments, if the error signal indicates that the output swing of the output signal 114 can be higher than the target output swing, this can indicate that the AGC state value determined by the AGC component 202 is to be relatively higher or increased, which can correspond to or indicate that the overall gain level associated with the group of amplifier components (e.g., 102, 104, 106, and/or 108) is to be reduced. If the error signal indicates that the output swing of the output signal 114 can be lower than the target output swing, this can indicate that the AGC state value determined by the AGC component 202 is to be relatively lower or reduced, which can correspond to or indicate that the overall gain level associated with the group of amplifier components (e.g., 102, 104, 106, and/or 108) is to be increased.

In some embodiments, the AGC component 202 can comprise a digital-to-analog-converter (DAC) component (DAC COMP) 210 that can comprise a group of DAC sub-components that can be utilized to facilitate controlling and/or adjusting (e.g., increasing or decreasing) the respective gain levels associated with the respective amplifier components (e.g., 102, 104, 106, and/or 108) of the system 200, based at least in part on the error voltage signal, in accordance with the amplifier gain adjustment sequence. The respective DAC sub-components of the DAC component 210 can be associated with (e.g., electronically connected to) the respective amplifier components (e.g., 102, 104, 106, and/or 108). In some embodiments, the respective DAC sub-components can be associated with respective AGC states and/or respective AGC state values, such that, for example, at a particular time, the DAC component 210 can engage or utilize a particular DAC sub-component that is associated with a particular AGC state and/or particular AGC state value. For instance, a first DAC sub-component can be associated with a first portion of AGC states and/or a first portion of AGC state values, a second DAC sub-component can be associated with a second portion of AGC states and/or a second portion of AGC state values, and/or another DAC sub-component can be associated with another portion of AGC states and/or another portion of AGC state values.

In accordance with various embodiments, the AGC component 202 can comprise (e.g., optionally can comprise) a gain manager component (GAIN MGR COMP) 212 that can facilitate controlling respective adjustments to the respective gain levels of the respective amplifier components (e.g., 102, 104, 106, and/or 108), in accordance with the amplifier gain adjustment sequence. The gain manager component 212 can comprise sub-components (e.g., electronic or hardware components) that can implement electronic circuit logic that can correspond to, or can be representative of, the amplifier gain adjustment sequence to facilitate implementing the amplifier gain adjustment sequence. The gain manager component 212, employing the electronic circuit logic, can determine whether the overall gain level associated with the group of amplifier components is to be increased, be decreased, or remain the same, based at least in part on the error voltage signals received from the averaging component 208. If it is determined that the overall gain level associated with the group of amplifier components is to be adjusted (e.g., increased or decreased), the gain manager component 212, employing the electronic circuit logic, can determine which amplifier component (e.g., 102, 104, 106, or 108) of the group is to have its gain level adjusted (e.g., partially adjusted), in accordance with the amplifier gain adjustment sequence.

In response to determining that a particular amplifier component (e.g., 102, 104, 106, or 108) is to have its gain level adjusted or partially adjusted, the gain manager component 212 can generate a control signal that corresponds to the particular amplifier component (e.g., 102, 104, 106, or 108) that is to have its gain level adjusted or partially adjusted and/or corresponds to the amount of the gain level adjustment, in accordance with the amplifier gain adjustment sequence. The gain manager component 212 can transmit the control signal (e.g., a digital control signal) to the DAC component 210, and the DAC component 210 can control the respective DAC sub-components, based at least in part on the control signal, to have a DAC sub-component associated with the particular amplifier component adjust or facilitate adjustment of the gain level associated with the particular amplifier component. For example, the DAC sub-component can convert the control signal to an analog current signal having a current level that can correspond to the AGC state value and associated AGC state, and can provide (e.g., transmit or output) the analog current signal to a variable resistor of or associated with the particular amplifier component to adjust or facilitate adjustment of the variable resistor to adjust or partially adjust the gain level associated with the particular amplifier component.

For example, if the gain manager component 212 determines that the first gain level associated with the first amplifier component 102 is to be adjusted (e.g., partially adjusted), in accordance with the amplifier gain adjustment sequence, the gain manager component 212 can communicate a control signal, which can indicate that the first gain level associated with the first amplifier component 102 is to be partially adjusted, to the DAC component 210. Based at least in part on the control signal, the DAC component 210 can control the DAC sub-component associated with the first amplifier component 102 to have the first gain level adjusted.

In accordance with various embodiments, the system 200 also can comprise amplifier regulator components that can be associated with (e.g., electrically connected to), and can regulate supply voltages supplied to, the amplifier components (e.g., 102, 104, 106, and/or 108). For instance, the system 200 can comprise the first amplifier regulator component 118 (e.g., TIA regulator component) that can be associated with the first amplifier component 102 (e.g., TIA component), and the second amplifier regulator component 120 (e.g., VGA regulator component) that can be associated with the second, third, and/or fourth amplifier components 104, 106, and/or 108 (e.g., VGA components), such as described herein. The first amplifier regulator component 118 and the second amplifier regulator component 120 also can be associated with (e.g., electrically connected to) the AGC component 116 and can receive state information, comprising the AGC state value indicative or representative of the AGC state, from the AGC component 116 on a desired time basis (e.g., regularly, constantly or substantially constantly, periodically, or dynamically or aperiodically), such as described herein. In some embodiments, the DAC component 210 of the AGC component 116 can output a current signal, which can comprise, can be, or can be representative of the state information (e.g., a current level of the current signal can be representative of or can correspond to the state information, such as the AGC state value), to the first amplifier regulator component 118 and the second amplifier regulator component 120, to facilitate controlling or adjusting the respective supply voltage levels that can be output from the first amplifier regulator component 118 and the second amplifier regulator component 120 to the respective amplifier components (e.g., 102, 104, 106, and/or 108). For example, a DAC sub-component (e.g., of the DAC component 210) that is associated with an AGC state associated with the AGC state value can provide (e.g., transmit or output) a current signal that can have a current level that can correspond to, can be indicative of, or can be representative of the AGC state value associated with the AGC state.

In some embodiments, the first amplifier regulator component 118 can comprise the first supply voltage controller component 122 that can control (e.g., adjust, modify, or maintain) a supply voltage level of a supply voltage that can be supplied by the first amplifier regulator component 118 to the first amplifier component 102, based at least in part on the state information, comprising the state value, in accordance with the first function or first mapping, such as described herein. The second amplifier regulator component 120 can comprise a second supply voltage controller component 124 that can control respective supply voltage levels of respective supply voltages that can be supplied to the second, third, and/or fourth amplifier components 104, 106, and/or 108, based at least in part on the state information, comprising the state value, in accordance with the second function or second mapping, such as described herein.

The supply voltage controller components and techniques described herein, by controlling supply voltage levels supplied by amplifier regulator components to the amplifier components can provide enhanced (e.g., improved or optimized) performance of the systems and devices described herein, over existing systems, devices, and techniques relating to providing supply voltages to amplifiers. The supply voltage controller components and techniques described herein can provide for enhanced sensitivity (e.g., improved, increased, or optimized sensitivity), overload (e.g., improved, increased, or optimized overload, such as higher overload and/or reduced peaking at overload), and/or BER floor (e.g., improved, lower, or optimized BER floor). The supply voltage controller components and techniques described herein can desirably mitigate (e.g., reduce or minimize) undesirable (e.g., unwanted) peaking associated with the output signal, while also desirably mitigating (e.g., reducing or minimizing) compression of the output signal, and can generate an output signal that can have a desirably (e.g., suitably, enhancedly, or optimally) flat response (e.g., a maximally flat frequency response, or virtually, or substantially close to, a maximally flat frequency response), which can be improvements over existing techniques relating to providing supply voltages to amplifiers.

In some embodiments, components (e.g., diode component, amplifier components, buffer component, AGC component, amplifier regulator components, supply voltage controller components, and/or other component(s)) of a system of the systems (e.g., system 100, system 200, or other system) described herein can be formed on a single integrated circuit (IC) chip or die. In other embodiments, respective components of a system of the systems described herein can be formed on respective IC chips or dies.

As disclosed, in some embodiments, the system (e.g., system 100, system 200, or other system described herein), including the group of amplifier components (e.g., 102, 104, 106, and/or 108), the AGC component (e.g., 116 or 202), the first amplifier regulator component 118, the first supply voltage controller component 122, the second amplifier regulator component 120, and the second supply voltage controller component 124 can be implemented as hardware components and logic on an IC chip(s). The system (e.g., system 100, system 200, or other system described herein), by having the AGC component (e.g., 116 or 202) transmit the AGC state information, comprising the AGC state value, to the first amplifier regulator component 118 and/or the first supply voltage controller component 122, and to the second amplifier regulator component 120 and/or the second supply voltage controller component 124, can facilitate desirably controlling (e.g., suitably, enhancedly, or optimally controlling with desired granularity) the respective supply voltage levels of the respective supply voltage supplied by the first amplifier regulator component 118 and the second amplifier regulator component 120 to the respective amplifier components (e.g., 102, 104, 106, and/or 108), based at least in part on the AGC state value and/or associated AGC state, in accordance with the respective (e.g., first and second) functions or mappings of AGC states values to supply voltage levels, such as more fully described herein. Another advantage of having the system (e.g., system 100, system 200, or other system described herein), including its components, implemented as hardware components and logic on the IC chip(s) is that, if and as desired, with regard to the second subgroup of AGC state values (e.g., AGC state values ranging from 504 to 1007, or other desired range of AGC state values), the threshold AGC state values (e.g., threshold transition AGC state values) utilized by the AGC component (e.g., 116 or 202), first supply voltage controller component 122, and/or first amplifier regulator component 118 to determine whether to increase the supply voltage level supplied to the first amplifier component 102 can be the same (or at least substantially the same) threshold AGC state values utilized by the first supply voltage controller component 122 to determine whether to decrease the supply voltage level supplied to the first amplifier component 102, and the threshold AGC state values (e.g., threshold transition AGC state values) utilized by the AGC component (e.g., 116 or 202), second supply voltage controller component 124, and/or second amplifier regulator component 120 to determine whether to decrease the supply voltage level supplied to the second, third, and/or fourth amplifier components 104, 106, and/or 108 can be the same (or at least substantially the same) threshold AGC state values utilized by the second supply voltage controller component 124 to determine whether to increase the supply voltage level supplied to the second, third, and/or fourth amplifier components 104, 106, and/or 108.

For instance, due in part to the hardware implementation of the components and logic of the system (e.g., system 100, system 200, or other system described herein), if and as desired, in the system, the steps (e.g., adjustments) of the respective supply voltage levels can be desirably (e.g., suitably, enhancedly, or optimally) small (e.g., on the order of millivolts (mV), such as 1.0 mV, 2.0 mV, 3.0 mV, . . . 10 mV, or other desirably small voltage) when transitioning from one AGC state value to a next (higher or lower) AGC state value. As a result, if and as desired, the system (e.g., system 100, system 200, or other system described herein) can utilize the same threshold AGC state values for transitioning up from a lower AGC state value to a next higher AGC state value and for transitioning down from a higher AGC state value to a next (e.g., adjacent) lower AGC state value. That is, with this disclosed hardware implementation of the system (e.g., system 100, system 200, or other system described herein), it is not necessary to create or establish a hysteresis into the system, utilizing different AGC threshold state values for upward AGC state transitions than other AGC threshold state values that are used for downward AGC state transitions, in order to prevent the system from rapidly oscillating or transitioning back and forth between AGC states due to small changes in the AGC state value.

Figure 3:
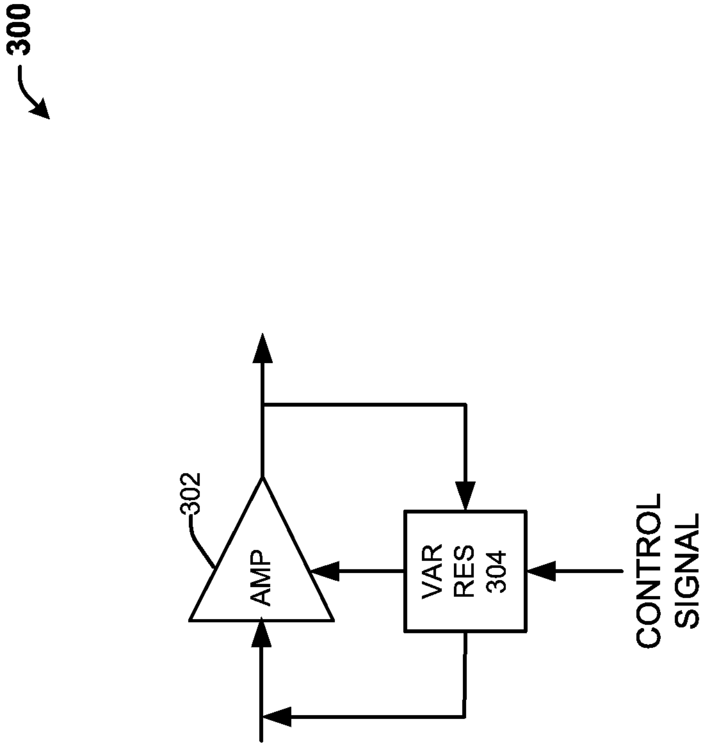
FIG. 3 illustrates a block diagram of a non-limiting example amplifier component that can a variable gain level and can receive a supply voltage that can be varied, in accordance with various aspects and embodiments of the disclosed subject matter.

Referring to FIG. 3, FIG. 3 illustrates a block diagram of a non-limiting example amplifier component 300 that can a variable gain level and can receive a supply voltage that can be varied, in accordance with various aspects and embodiments of the disclosed subject matter. The amplifier component 300 can be, for example, a TIA, a VGA, or other type of amplifier. In accordance with various embodiments, the amplifier component 300 can comprise a single-ended input or a differential input, and/or can comprise a single-ended output or a differential output (although, for reasons of brevity and clarity, the amplifier component 300 is depicted with a single-ended input and single-ended output). The amplifier component 300 can comprise an amplifier (AMP) 302 (e.g., an operational amplifier (op-amp) or other amplifier) that can modify or amplify electrical signals received at the input of the amplifier 302 to generate a modified or amplified electrical signal as an output from the amplifier 302.

The amplifier component 300 also can include a variable resistor component (VAR RES) 304 that, can be associated with the output and input of the amplifier 302, as part of a feedback loop associated with the amplifier 302. The gain level of the amplifier component 300 can be varied based at least in part on the varied amount of resistance of the variable resistor component 304. The amount of resistance of the variable resistor component 304 can be desirably varied between a maximum amount of resistance and a minimum amount of resistance based at least in part on a control signal received from the AGC component (e.g., a control signal received from the DAC component 210 of the AGC component 202). In some embodiments, the variable resistor component 304 can comprise one or more resistors having a desired resistance value(s) and/or logic and circuitry, such as complementary metal-oxide-semiconductor (CMOS) logic and circuitry, wherein the logic and circuitry can facilitate varying or adjusting the amount of resistance of the variable resistor component 304, based at least in part on the control signal received from the AGC component.

The amplifier component 300 also can receive a supply voltage from an amplifier regulator component (e.g., first amplifier regulator component with regard to the first amplifier component; second amplifier regulator component with regard to the second, third, and/or fourth amplifier components), such as described herein. In certain embodiments, the supply voltage level of the supply voltage received by the amplifier component 300 from the amplifier regulator component can be desirably (e.g., enhancedly, suitably, or optimally) varied or adjusted by a supply voltage controller component (e.g., first supply voltage controller component with regard to the first amplifier component; second supply voltage controller component with regard to the second, third, and/or fourth amplifier components) of or associated with the amplifier regulator component (e.g., first amplifier regulator component; or second amplifier regulator component), in accordance with a desired function or mapping (e.g., first function or first mapping; or second function or second mapping) of supply voltage levels in relation to AGC state values or AGC states, such as described herein, to facilitate desirable (e.g., enhanced, suitable, or optimal) operation of the amplifier component 300 and the associated system or device overall.

Figure 4:
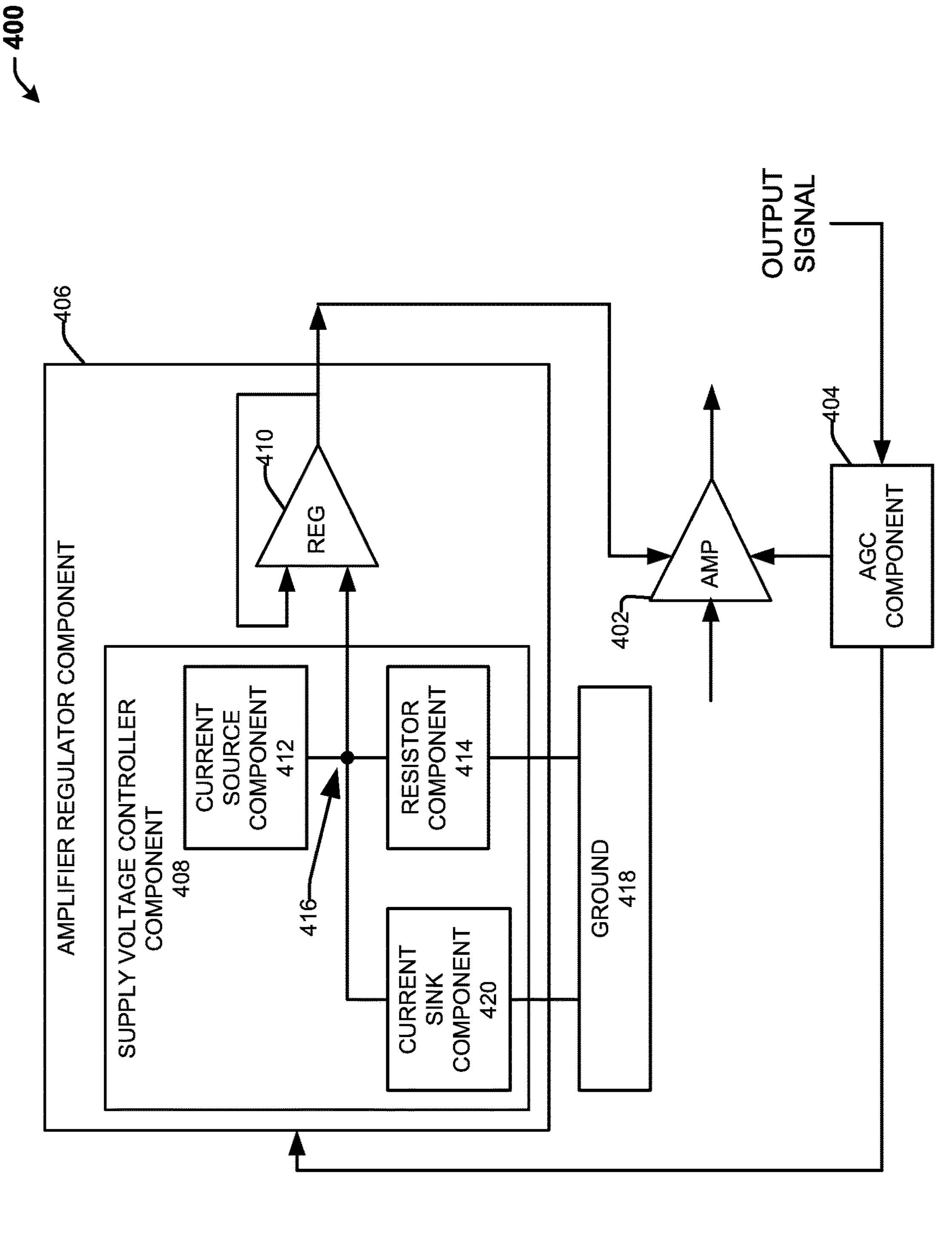
FIG. 4 depicts a block diagram of a non-limiting example system that can comprise an amplifier regulator component that can include or be associated with a supply voltage controller component that can desirably control a supply voltage level of a supply voltage supplied to an amplifier component, such as a TIA, in accordance with various aspects and embodiments of the disclosed subject matter.

Turning to FIG. 4, FIG. 4 depicts a block diagram of a non-limiting example system 400 that can comprise an amplifier regulator component that can include or be associated with a supply voltage controller component that can desirably control a supply voltage level of a supply voltage supplied to an amplifier component (e.g., TIA), in accordance with various aspects and embodiments of the disclosed subject matter. The system 400 can comprise the amplifier component (AMP) 402 (e.g., TIA), an AGC component 404, and the amplifier regulator component 406, which can comprise the supply voltage controller component 408. The amplifier component 402 (e.g., TIA) can be the same as, or can comprise the same or similar functionality as, the first amplifier component 102, such as described herein. The AGC component 404 can be the same as, or can comprise the same or similar functionality as, the AGC component 116, such as described herein. The amplifier regulator component 406 can be the same as, or can comprise the same or similar functionality as, the first amplifier regulator component 118, such as described herein. The supply voltage controller component 408 can be the same as, or can comprise the same or similar functionality as, the first supply voltage controller component 122, such as described herein.

The amplifier regulator component 406 can comprise a regulator component (REG) 410 (e.g., op-amp or voltage comparator that can operate as a regulator) that can receive, at an input (e.g., input port) of the regulator component 410, a reference voltage signal at a reference voltage level from the supply voltage controller component 408, wherein a feedback loop from the output (e.g., output port) of the regulator component 410 to the other input of the regulator component 410 can facilitate the regulating of the supply voltage signal that is output from the regulator component 410 to the amplifier component 402. The reference voltage level can range from a lower (e.g., lowest) voltage level to a higher (e.g., highest) voltage level, wherein the lower voltage level (e.g., 2.23 V or other desired relatively lower voltage level) can correspond to the second threshold supply voltage level (e.g., 2.23 V or other desired relatively lower voltage level) and the higher voltage level (e.g., 2.70 V or other desired relatively higher voltage level) can correspond to the first threshold supply voltage level (e.g., 2.70 V or other desired relatively higher voltage level).

The supply voltage controller component 408 can comprise a current source component 412 that can provide a desired level of current and a resistor component 414 that can have a desired resistance, wherein one end of the resistor component 414 can be associated with the output of the current source component 412 at the node 416 associated with (e.g., electrically connected to) the input of the regulator component 410 that can receive the reference voltage signal, and wherein the other end of the resistor component 414 can be associated with (e.g., electrically connected to) the ground 418. In some embodiments, the current level of the current provided (e.g., output) by the current source component 412 can be settable, programmable, and/or adjustable based at least in part on current source information (e.g., current source settings or parameters) that can be stored in one or more registers, storage locations, and/or other memory. In certain embodiments, the level of the current provided by the current source component 412 and the resistance level of the resistor component 414 respectively can be such that the voltage level of the signal produced by the current from the current source component 412 across the resistor component 414 (e.g., voltage level at the node 416) can be the higher voltage level (e.g., 2.7 V or other relatively higher voltage level), corresponding to the first threshold (e.g., highest or higher) supply voltage level, at least when there is no current being sinked or diverted from the node 416.

In some embodiments, to facilitate controlling or adjusting the supply voltage level of the supply voltage output by the amplifier regulator component 406, the supply voltage controller component 408 can comprise a current sink component 420 that, at its input, can be associated with the node 416, and thus, the output of the current source component 412 and the resistor component 414, wherein the output of the current sink component 420 can be associated with the ground 418. The current level of current sink component 420 can be settable, programmable, and/or adjustable based at least in part on current sink information (e.g., current sink settings or parameters) that can be stored in one or more registers, storage locations, and/or other memory. The supply voltage controller component 408 can be associated with (e.g., electrically connected to) the AGC component 404 and can receive the state information (e.g., state signal) relating to, indicating, or representative of the AGC state value or associated AGC state of the AGC component 404 as determined by the AGC component 404 based at least in part on the result analyzing the output signal from the group of amplifiers, comprising the amplifier component 402, such as described herein.

Based at least in part on the state information, the current level of the current sink component 420 can be controlled or adjusted (e.g., modified or varied) to a desired current level, which can range from 0 microamps (μA) to a desired high current level (e.g., 10 μA or other desired higher or maximum current level). For example, when the AGC state value is at 0 or a relatively lower AGC state value that does not satisfy (e.g., is below) the first threshold AGC state value (e.g., 504 or other desired first threshold AGC state value), the current sink component 420 can be controlled or adjusted to have a current level of 0 μA. As a result of the current level of the current sink component 420 being at 0 μA, no current is being sinked or diverted from the node 416, and the voltage level at the node 416 (e.g., the reference voltage signal) can be the higher (e.g., highest) voltage level (e.g., 2.70 V or other relatively higher voltage level), corresponding to the first threshold voltage level, based at least in part on the current provided by the current source component 412 across the resistor component 414, in accordance with the AGC state value and the first function or first mapping. As a result, the supply voltage level of the supply voltage output by the amplifier regulator component 406 to the amplifier component 402 can be at the first (e.g., highest or higher) threshold voltage level.

When the AGC state value is at a relatively higher AGC state value that satisfies (e.g., is at or above) the second threshold AGC state value (e.g., 1008 or other desired second threshold AGC state value), the current sink component 420 can be controlled or adjusted to have a current level of its output current at the desired high current level. As a result of the current level of the current sink component 420 being at the desired high current level, a desired amount of current can be sinked or diverted from the node 416, and the voltage level at the node 416 (e.g., the reference voltage signal) can be at the lower (e.g., lowest) voltage level (e.g., 2.23 V or other relatively lower voltage level), corresponding to the second threshold voltage level, based at least in part on the net current across the resistor component 414, in accordance with the AGC state value and the first function or first mapping, wherein the net current can be the amount of current provided by the current source component 412 less the amount of the current sinked or diverted from the node 416 by the current sink component 420. As a result, the supply voltage level of the supply voltage output by the amplifier regulator component 406 to the amplifier component 402 can be at the second (e.g., lowest or lower) threshold voltage level.

When the AGC state value is at a higher AGC state value that satisfies (e.g., is at or above) the first threshold AGC state value (e.g., 504 or other desired first threshold AGC state value), but does not satisfy (e.g., is below) the second threshold AGC state value (e.g., 1008 or other desired second threshold AGC state value), the current sink component 420 can be controlled or adjusted to have a current level of its output current be above 0 μA and below the desired high current level, in accordance with the AGC state value. As a result of the current level of the current sink component 420 being above 0 μA, but below the desired high current level, a certain amount of current can be sinked or diverted from the node 416, and the voltage level at the node 416 (e.g., the reference voltage signal) can be lower than the higher voltage level (e.g., lower than 2.70 V or other relatively higher voltage level) and above the lower voltage level (e.g., above 2.23 V or other relatively lower voltage level), based at least in part on the net current across the resistor component 414, in accordance with the AGC state value and the first function or first mapping, wherein the net current can be the amount of current provided by the current source component 412 less the certain amount of the current sinked or diverted from the node 416 by the current sink component 420. As a result, the supply voltage level of the supply voltage output by the amplifier regulator component 406 to the amplifier component 402 can be at a voltage level that can be lower than the first threshold voltage level and higher than the second threshold voltage level, in accordance with the AGC state value and the first function or first mapping.

It is to be appreciated and understood that the system 400 relating to controlling or adjusting the supply voltage level as a function of the AGC state value is but one example implementation for controlling or adjusting the supply voltage level as a function of the AGC state value, and other embodiments and implementations that can employ an amplifier regulator component, a supply voltage controller component, and/or the techniques described herein for controlling or adjusting the supply voltage level as a function of the AGC state value and/or AGC state are contemplated and are part of the disclosed subject matter.

Figure 5:
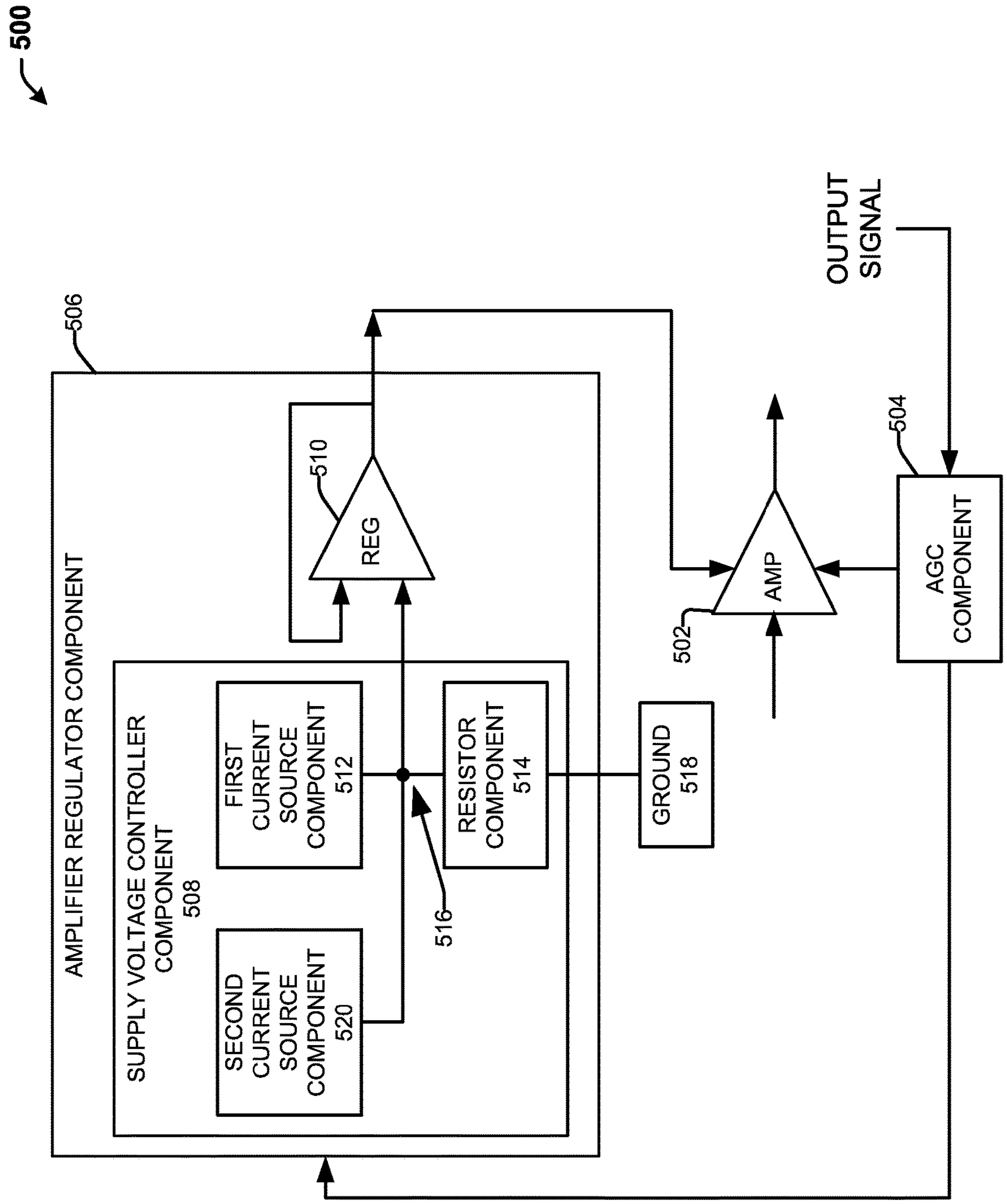
FIG. 5 illustrates a block diagram of a non-limiting example system that can comprise an amplifier regulator component that can include a supply voltage controller component that can desirably control a supply voltage level of a supply voltage supplied to an amplifier component(s), such as a VGA(s), in accordance with various aspects and embodiments of the disclosed subject matter.

Referring to FIG. 5, FIG. 5 illustrates a block diagram of a non-limiting example system 500 that can comprise an amplifier regulator component that can include a supply voltage controller component that can desirably control a supply voltage level of a supply voltage supplied to an amplifier component(s) (e.g., VGA(s)), in accordance with various aspects and embodiments of the disclosed subject matter. The system 500 can comprise the amplifier component (AMP) 502 (e.g., VGA), an AGC component 504, and the amplifier regulator component 506, which can comprise the supply voltage controller component 508. The amplifier component 502 can be the same as, or can comprise the same or similar functionality as, the second, third, or fourth amplifier component 104, 106, or 108, such as described herein. The AGC component 504 can be the same as, or can comprise the same or similar functionality as, the AGC component 116, such as described herein. The amplifier regulator component 506 can be the same as, or can comprise the same or similar functionality as, the second amplifier regulator component 120, such as described herein. The supply voltage controller component 508 can be the same as, or can comprise the same or similar functionality as, the second supply voltage controller component 124, such as described herein.

The amplifier regulator component 506 can comprise a regulator component (REG) 510 (e.g., op-amp or voltage comparator that can operate as a regulator) that can receive, at an input (e.g., input port) of the regulator component 510, a reference voltage signal at a reference voltage level from the supply voltage controller component 508, wherein a feedback loop from the output (e.g., output port) of the regulator component 510 to the other input of the regulator component 510 can facilitate the regulating of the supply voltage signal that is output from the regulator component 510 to the amplifier component 502. The reference voltage level can range from a lower (e.g., lowest) voltage level to a higher (e.g., highest) voltage level, wherein the lower voltage level (e.g., 2.23 V or other desired relatively lower voltage level) can correspond to the second threshold supply voltage level (e.g., 2.23 V or other desired relatively lower voltage level) and the higher voltage level (e.g., 2.70 V or other desired relatively higher voltage level) can correspond to the first threshold supply voltage level (e.g., 2.70 V or other desired relatively higher voltage level).

The supply voltage controller component 508 can comprise a first current source component 512 that can provide a desired level of current and a resistor component 514 that can have a desired resistance, wherein one end of the resistor component 514 can be associated with the output of the first current source component 512 at the node 516 associated with (e.g., electrically connected to) the input of the regulator component 510 that can receive the reference voltage signal, and wherein the other end of the resistor component 514 can be associated with (e.g., electrically connected to) the ground 518. In some embodiments, the current level of the current provided (e.g., output) by the first current source component 512 can be settable, programmable, and/or adjustable based at least in part on first current source information (e.g., first current source settings or parameters) that can be stored in one or more registers, storage locations, and/or other memory. In certain embodiments, the level of the current provided by the first current source component 512 and the resistance level of the resistor component 514 respectively can be such that the voltage level of the signal produced by the current from the first current source component 512 across the resistor component 514 (e.g., voltage level at the node 516) can be the lower voltage level (e.g., 2.23 V or other relatively lower voltage level), corresponding to the second threshold (e.g., lowest or lower) supply voltage level, at least when there is no additional current being added at the node 516.

In some embodiments, to facilitate controlling or adjusting the supply voltage level of the supply voltage output by the amplifier regulator component 506, the supply voltage controller component 508 can comprise a second current source component 520 that, at its output, can be associated with the node 516, and thus, the output of the first current source component 512 and the resistor component 514. The current level of second current source component 520 can be settable, programmable, and/or adjustable based at least in part on second current source information (e.g., second current source settings or parameters) that can be stored in one or more registers, storage locations, and/or other memory. The supply voltage controller component 508 can be associated with (e.g., electrically connected to) the AGC component 504 and can receive the state information (e.g., state signal) relating to, indicating, or representative of the AGC state value or associated AGC state of the AGC component 504 as determined by the AGC component 504 based at least in part on the result analyzing the output signal from the group of amplifiers, comprising the amplifier component 502, such as described herein.

Based at least in part on the state information, the current level of the second current source component 520 can be controlled or adjusted (e.g., modified or varied) to a desired current level, which can range from 0 μA to a desired high current level (e.g., 10 μA or other desired higher or maximum current level). For example, when the AGC state value is at 0 or a relatively lower AGC state value that does not satisfy (e.g., is below) the first threshold AGC state value (e.g., 504 or other desired first threshold AGC state value), the second current source component 520 can be controlled or adjusted to have a current level of 0 μA. As a result of the current level of the second current source component 520 being at 0 μA, no current is being provided to the node 516 by the second current source component 520, and the voltage level at the node 516 (e.g., the reference voltage signal) can be the lower (e.g., lowest) voltage level (e.g., 2.23 V or other relatively lower voltage level), corresponding to the second threshold voltage level, based at least in part on the current provided by the first current source component 512 across the resistor component 514, in accordance with the AGC state value and the second function or second mapping. As a result, the supply voltage level of the supply voltage output by the amplifier regulator component 506 to the amplifier component 502 can be at the second (e.g., lowest or lower) threshold voltage level.

When the AGC state value is at a relatively higher AGC state value that satisfies (e.g., is at or above) the second threshold AGC state value (e.g., 1008 or other desired second threshold AGC state value), the second current source component 520 can be controlled or adjusted to have a current level of its output current at the desired high current level. As a result of the current level of the second current source component 520 being at the desired high current level, a desired amount of current can be provided or added to the node 516 by the second current source component 520 (in addition to the current provided by the first current source component 512), and the voltage level at the node 516 (e.g., the reference voltage signal) can be at the higher (e.g., highest) voltage level (e.g., 2.70 V or other relatively higher voltage level), corresponding to the first threshold voltage level, based at least in part on the net current across the resistor component 514, in accordance with the AGC state value and the second function or second mapping, wherein the net current can be the amount of current provided by the first current source component 512 plus the amount of the current provided by the second current source component 520 at the node 516. As a result, the supply voltage level of the supply voltage output by the amplifier regulator component 506 to the amplifier component 502 can be at the first (e.g., highest or higher) threshold voltage level.

When the AGC state value is at a higher AGC state value that satisfies (e.g., is at or above) the first threshold AGC state value (e.g., 504 or other desired first threshold AGC state value), but does not satisfy (e.g., is below) the second threshold AGC state value (e.g., 1008 or other desired second threshold AGC state value), the second current source component 520 can be controlled or adjusted to have a current level of its output current be above 0 μA and below the desired high current level, in accordance with the AGC state value. As a result of the current level of the second current source component 520 being above 0 μA, but below the desired high current level, a certain amount of current can be provided or added at the node 516 (in addition to the current provided by the first current source component 512), and the voltage level at the node 516 (e.g., the reference voltage signal) can be higher than the lower voltage level (e.g., above 2.23 V or other relatively lower voltage level) and lower than the higher voltage level (e.g., lower than 2.7 V or other relatively higher voltage level), based at least in part on the net current across the resistor component 514, in accordance with the AGC state value and the second function or second mapping, wherein the net current can be the amount of current provided by the first current source component 512 plus the certain amount of the current provided or added by the second current source component 520 at the node 516. As a result, the supply voltage level of the supply voltage output by the amplifier regulator component 506 to the amplifier component 502 can be at a voltage level that can be higher than the second threshold voltage level and lower than the first threshold voltage level, in accordance with the AGC state value and the second function or second mapping.

It is to be appreciated and understood that, while the system 500 comprises the amplifier regulator component 506 providing a supply voltage to the amplifier component 502 (e.g., VGA), in other embodiments, the amplifier regulator component 506 can provide respective supply voltages to one or more respective amplifier components (e.g., one or more VGAs), as desired. It also is to be appreciated and understood that the system 500 relating to controlling or adjusting the supply voltage level as a function of the AGC state value is but one example implementation for controlling or adjusting the supply voltage level as a function of the AGC state value, and other embodiments and implementations that can employ an amplifier regulator component, a supply voltage controller component, and/or the techniques described herein for controlling or adjusting the supply voltage level as a function of the AGC state value and/or AGC state are contemplated and are part of the disclosed subject matter.

Figure 6:
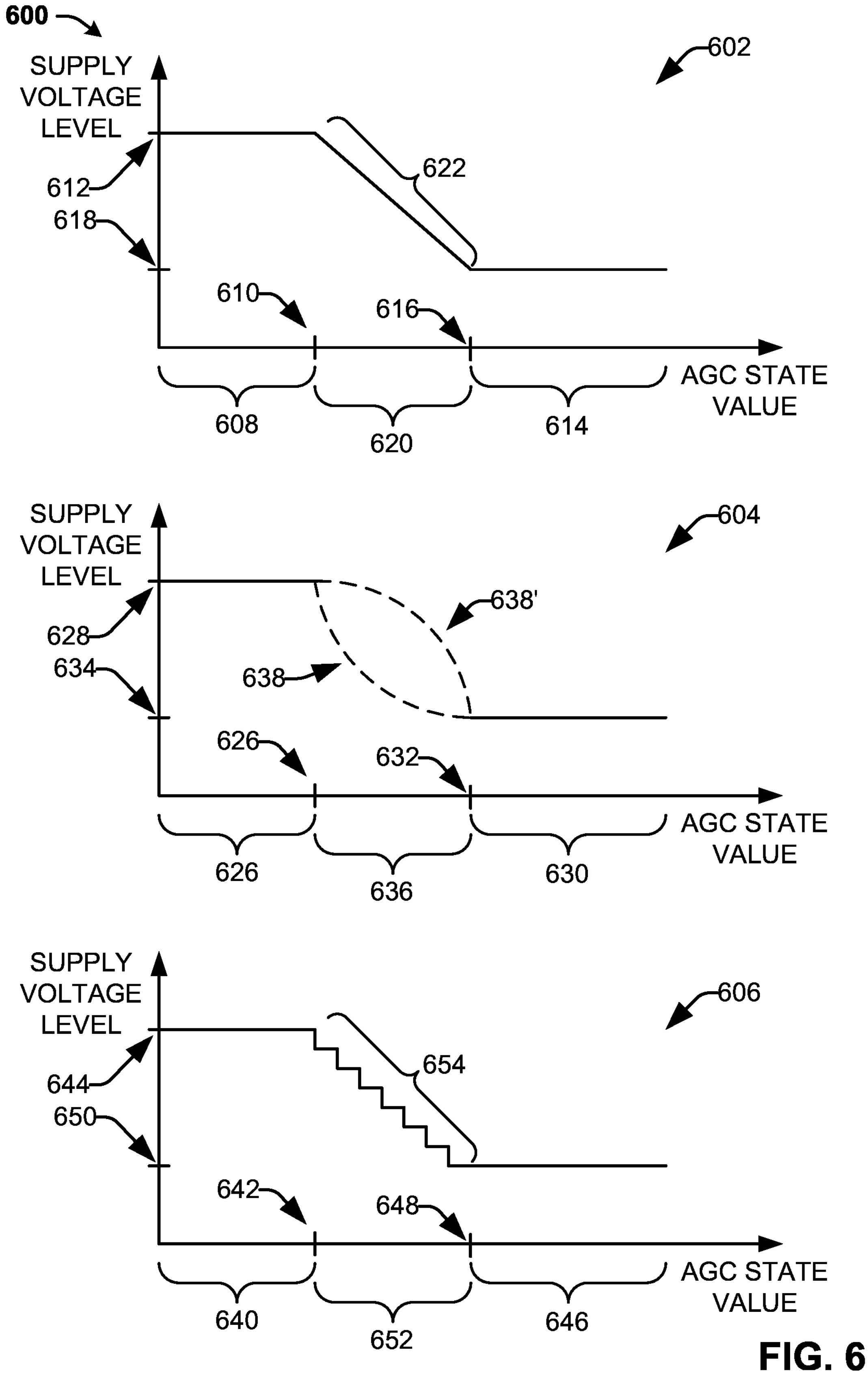
FIG. 6 depicts a diagram of non-limiting example graphical representations of respective first functions or first mappings of supply voltage levels in relation to automatic gain level (AGC) state values or AGC states that can be utilized by a first supply voltage controller component to facilitate desirably controlling a supply voltage level supplied to a first amplifier component, such as a TIA, in accordance with various aspects and embodiments of the disclosed subject matter.

Turning to FIG. 6, FIG. 6 depicts a diagram of non-limiting example graphical representations 600 of respective first functions or first mappings of supply voltage levels in relation to AGC state values or AGC states that can be utilized by the first supply voltage controller component to facilitate desirably controlling a supply voltage level supplied to the first amplifier component (e.g., TIA), in accordance with various aspects and embodiments of the disclosed subject matter. The example graphical representations 600 can comprise graphical representation 602, graphical representation 604, and graphical representation 606.

The graphical representation 602 can comprise a graph of supply voltage levels of the supply voltage that can be supplied by the first amplifier regulator component, comprising the first supply voltage controller component, to the first amplifier component as a function of AGC state values associated with the AGC component, in accordance with a first type of first function or first mapping. As can be observed in the graphical representation 602, with regard to a first subgroup of AGC state values 608 that does not satisfy (e.g., is below) a first threshold AGC state value 610, the first supply voltage controller component can control or adjust the supply voltage provided by the first amplifier regulator component to the first amplifier component to be at a first (e.g., a highest or higher) threshold voltage level 612, in accordance with the first type of first function or first mapping. As also can be observed in the graphical representation 602, with regard to a third subgroup of AGC state values 614 that satisfies (e.g., is at or above) a second threshold AGC state value 616, the first supply voltage controller component can control or adjust the supply voltage provided by the first amplifier regulator component to the first amplifier component to be at a second (e.g., a lowest or lower) threshold voltage level 618, in accordance with the first type of first function or first mapping.

As further can be observed in the graphical representation 602, with regard to a second subgroup of AGC state values 620 that satisfies (e.g., is at or above) the first threshold AGC state value 610, but does not satisfy the second threshold AGC state value 616, the first supply voltage controller component can control or adjust the supply voltage provided by the first amplifier regulator component to the first amplifier component to be at a supply voltage level that can range between the first threshold voltage level 612 and the second threshold voltage level 618, based at least in part on the particular AGC state value (e.g., determined from the output signal associated with the group of amplifier components), in accordance with a slope 622 of the graphical representation 602 that can be representative of a portion of the first type of first function or first mapping relating to the second subgroup of AGC state values 620. The slope 622 can be linear or substantially linear spanning supply voltage levels that can decrease in a linear or substantially linear manner as the AGC state value increases from the first threshold AGC state value 610 towards the second threshold AGC state value 616.

The graphical representation 604 can comprise a graph of supply voltage levels of the supply voltage that can be supplied by the first amplifier regulator component to the first amplifier component as a function of AGC state values associated with the AGC component, in accordance with a second type of first function or first mapping. As can be observed in the graphical representation 604, with regard to a first subgroup of AGC state values 624 that does not satisfy (e.g., is below) a first threshold AGC state value 626, the first supply voltage controller component can control or adjust the supply voltage provided by the first amplifier regulator component to the first amplifier component to be at a first (e.g., a highest or higher) threshold voltage level 628, in accordance with the second type of first function or first mapping. As also can be observed in the graphical representation 604, with regard to a third subgroup of AGC state values 630 that satisfies (e.g., is at or above) a second threshold AGC state value 632, the first supply voltage controller component can control or adjust the supply voltage provided by the first amplifier regulator component to the first amplifier component to be at a second (e.g., a lowest or lower) threshold voltage level 634, in accordance with the second type of first function or first mapping.

As further can be observed in the graphical representation 604, with regard to a second subgroup of AGC state values 636 that satisfies (e.g., is at or above) the first threshold AGC state value 626, but does not satisfy the second threshold AGC state value 632, the first supply voltage controller component can control or adjust the supply voltage provided by the first amplifier regulator component to the first amplifier component to be at a supply voltage level that can range between the first threshold voltage level 628 and the second threshold voltage level 634, based at least in part on the particular AGC state value, in accordance with a curve 638 or alternate curve 638' of the graphical representation 604 that can be representative of a portion of the second type of first function or first mapping relating to the second subgroup of AGC state values 636. The curve 638 or alternate curve 638' each can be non-linear spanning supply voltage levels that can decrease in a respective non-linear manner as the AGC state value increases from the first threshold AGC state value 626 towards the second threshold AGC state value 632.

The graphical representation 606 can comprise a graph of supply voltage levels of the supply voltage that can be supplied by the first amplifier regulator component to the first amplifier component as a function of AGC state values associated with the AGC component, in accordance with a third type of first function or first mapping. As can be observed in the graphical representation 606, with regard to a first subgroup of AGC state values 640 that does not satisfy (e.g., is below) a first threshold AGC state value 642, the first supply voltage controller component can control or adjust the supply voltage provided by the first amplifier regulator component to the first amplifier component to be at a first (e.g., a highest or higher) threshold voltage level 644, in accordance with the third type of first function or first mapping. As also can be observed in the graphical representation 606, with regard to a third subgroup of AGC state values 646 that satisfies (e.g., is at or above) a second threshold AGC state value 648, the first supply voltage controller component can control or adjust the supply voltage provided by the first amplifier regulator component to the first amplifier component to be at a second (e.g., a lowest or lower) threshold voltage level 650, in accordance with the third type of first function or first mapping.

As further can be observed in the graphical representation 606, with regard to a second subgroup of AGC state values 652 that satisfies (e.g., is at or above) the first threshold AGC state value 642, but does not satisfy the second threshold AGC state value 648, the first supply voltage controller component can control or adjust the supply voltage provided by the first amplifier regulator component to the first amplifier component to be at a supply voltage level that can range between the first threshold voltage level 644 and the second threshold voltage level 650, based at least in part on the particular AGC state value, in accordance with a stepwise supply voltage level adjustment 654 of the graphical representation 606 that can be representative of a portion of the third type of first function or first mapping relating to the second subgroup of AGC state values 652. The stepwise supply voltage level adjustment 654 can span supply voltage levels that can decrease in a respective stepwise manner as the AGC state value increases from the first threshold AGC state value 642 towards the second threshold AGC state value 648, wherein the supply voltage can be at one supply voltage level for a first range (e.g., a first portion) of AGC state values and can step down to a lower supply voltage level for a second range (e.g., adjacent portion) of AGC state values, and can continue to step down from there as the AGC state value increases up to the second threshold AGC state value 648.

It is to be appreciated and understood that the example graphical representations 600 are merely exemplary graphical representations of respective types of first functions or first mappings of supply voltage levels in relation to AGC state values or AGC states that can be utilized by the first supply voltage controller component to facilitate desirably controlling a supply voltage level supplied to the first amplifier component, and, in other embodiments, the first amplifier regulator component and/or the first supply voltage controller component can utilize (e.g., apply or implement) a different type of first function or first mapping of supply voltage levels in relation to AGC state values or AGC states to facilitate desirably controlling a supply voltage level supplied to the first amplifier component.

Figure 7:
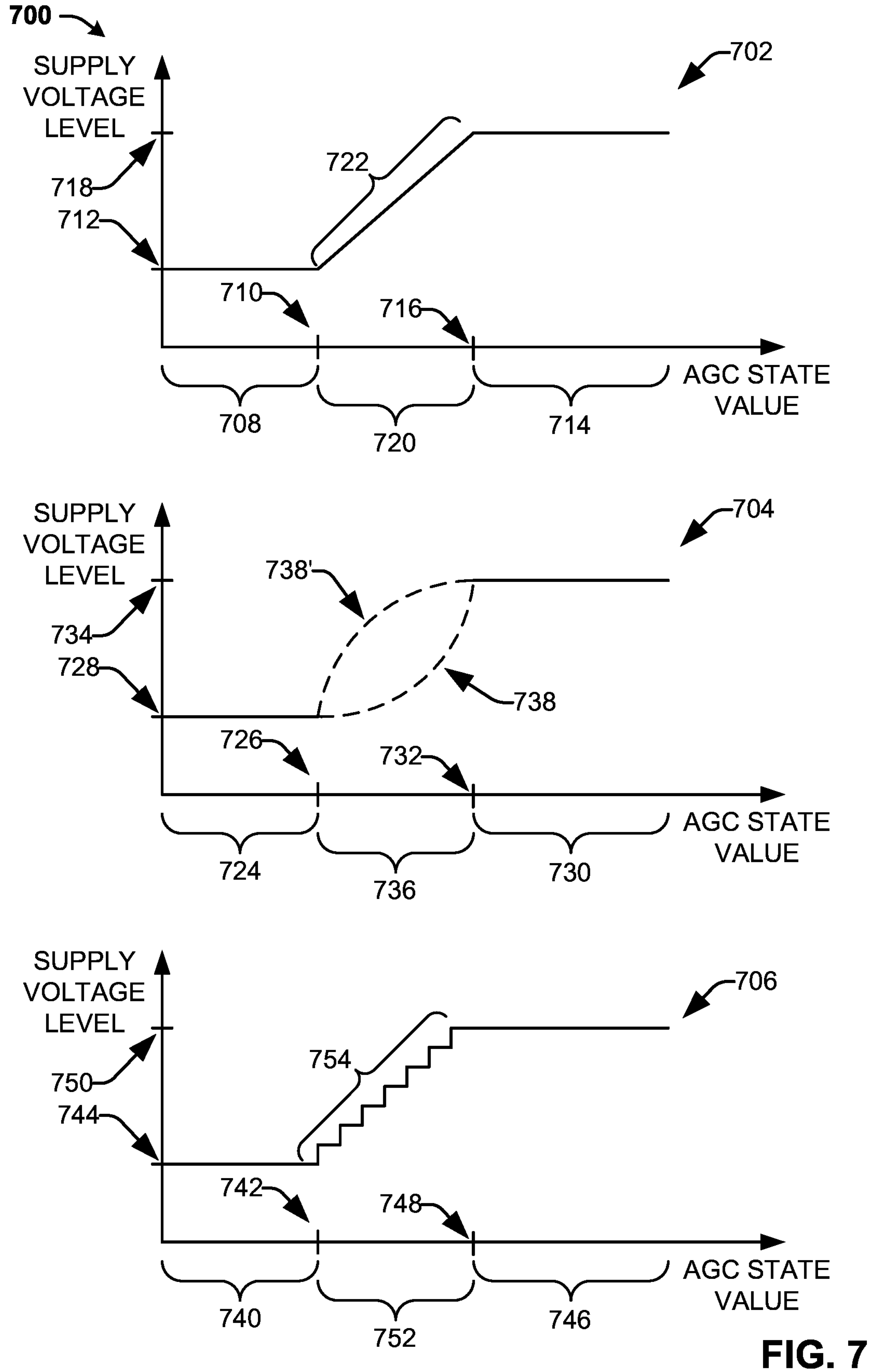
FIG. 7 presents a diagram of non-limiting example graphical representations of respective second functions or second mappings of supply voltage levels in relation to AGC state values or AGC states that can be utilized by a second supply voltage controller component to facilitate desirably controlling a supply voltage level supplied to the second, third, and/or fourth amplifier components, such as VGAs, in accordance with various aspects and embodiments of the disclosed subject matter.

Referring to FIG. 7, FIG. 7 presents a diagram of non-limiting example graphical representations 700 of respective second functions or second mappings of supply voltage levels in relation to AGC state values or AGC states that can be utilized by the second supply voltage controller component to facilitate desirably controlling a supply voltage level supplied to the second, third, and/or fourth amplifier components (e.g., VGA(s)), in accordance with various aspects and embodiments of the disclosed subject matter. The example graphical representations 700 can comprise graphical representation 702, graphical representation 704, and graphical representation 706.

The graphical representation 702 can comprise a graph of supply voltage levels of the supply voltage that can be supplied by the second amplifier regulator component, comprising the second supply voltage controller component, to an amplifier component(s) (e.g., the second, third, and/or fourth amplifier components) as a function of AGC state values associated with the AGC component, in accordance with a first type of second function or second mapping. As can be observed in the graphical representation 702, with regard to a first subgroup of AGC state values 708 that does not satisfy (e.g., is below) a first threshold AGC state value 710, the second supply voltage controller component can control or adjust the supply voltage provided by the second amplifier regulator component to the associated amplifier component to be at a second (e.g., a lowest or lower) threshold voltage level 712, in accordance with the first type of second function or second mapping. As also can be observed in the graphical representation 702, with regard to a third subgroup of AGC state values 714 that satisfies (e.g., is at or above) a second threshold AGC state value 716, the second supply voltage controller component can control or adjust the supply voltage provided by the second amplifier regulator component to the amplifier component to be at a first (e.g., a highest or higher) threshold voltage level 718, in accordance with the first type of second function or second mapping.

As further can be observed in the graphical representation 702, with regard to a second subgroup of AGC state values 720 that satisfies (e.g., is at or above) the first threshold AGC state value 710, but does not satisfy the second threshold AGC state value 716, the second supply voltage controller component can control or adjust the supply voltage provided by the second amplifier regulator component to the amplifier component to be at a supply voltage level that can range between the second threshold voltage level 712 and the first threshold voltage level 718, based at least in part on the particular AGC state value (e.g., determined from the output signal associated with the group of amplifier components), in accordance with a slope 722 of the graphical representation 702 that can be representative of a portion of the first type of second function or second mapping relating to the second subgroup of AGC state values 714. The slope 722 can be linear or substantially linear spanning supply voltage levels that can increase in a linear or substantially linear manner as the AGC state value increases from the first threshold AGC state value 710 towards the second threshold AGC state value 716.

The graphical representation 704 can comprise a graph of supply voltage levels of the supply voltage that can be supplied by the second amplifier regulator component to the amplifier component as a function of AGC state values associated with the AGC component, in accordance with a second type of second function or second mapping. As can be observed in the graphical representation 704, with regard to a first subgroup of AGC state values 724 that does not satisfy (e.g., is below) a first threshold AGC state value 726, the second supply voltage controller component can control or adjust the supply voltage provided by the second amplifier regulator component to the amplifier component to be at a second (e.g., a lowest or lower) threshold voltage level 728, in accordance with the second type of second function or second mapping. As also can be observed in the graphical representation 704, with regard to a third subgroup of AGC state values 730 that satisfies (e.g., is at or above) a second threshold AGC state value 732, the second supply voltage controller component can control or adjust the supply voltage provided by the second amplifier regulator component to the amplifier component to be at a first (e.g., a highest or higher) threshold voltage level 734, in accordance with the second type of second function or second mapping.

As further can be observed in the graphical representation 704, with regard to a second subgroup of AGC state values 736 that satisfies (e.g., is at or above) the first threshold AGC state value 726, but does not satisfy the second threshold AGC state value 732, the second supply voltage controller component can control or adjust the supply voltage provided by the second amplifier regulator component to the amplifier component to be at a supply voltage level that can range between the second threshold voltage level 728 and the first threshold voltage level 734, based at least in part on the particular AGC state value, in accordance with a curve 738 or alternate curve 738' of the graphical representation 704 that can be representative of a portion of the second type of second function or second mapping relating to the second subgroup of AGC state values 736. The curve 738 or alternate curve 738' each can be non-linear spanning supply voltage levels that can increase in a respective non-linear manner as the AGC state value increases from the first threshold AGC state value 726 towards the second threshold AGC state value 732.

The graphical representation 706 can comprise a graph of supply voltage levels of the supply voltage that can be supplied by the second amplifier regulator component to the amplifier component as a function of AGC state values associated with the AGC component, in accordance with a third type of second function or second mapping. As can be observed in the graphical representation 706, with regard to a first subgroup of AGC state values 740 that does not satisfy (e.g., is below) a first threshold AGC state value 742, the second supply voltage controller component can control or adjust the supply voltage provided by the second amplifier regulator component to the amplifier component to be at a second (e.g., a lowest or lower) threshold voltage level 744, in accordance with the third type of second function or second mapping. As also can be observed in the graphical representation 706, with regard to a third subgroup of AGC state values 746 that satisfies (e.g., is at or above) a second threshold AGC state value 748, the second supply voltage controller component can control or adjust the supply voltage provided by the second amplifier regulator component to the amplifier component to be at a first (e.g., a highest or higher) threshold voltage level 750, in accordance with the third type of second function or second mapping.

As further can be observed in the graphical representation 706, with regard to a second subgroup of AGC state values 752 that satisfies (e.g., is at or above) the first threshold AGC state value 742, but does not satisfy the second threshold AGC state value 748, the second supply voltage controller component can control or adjust the supply voltage provided by the second amplifier regulator component to the amplifier component to be at a supply voltage level that can range between the second threshold voltage level 744 and the first threshold voltage level 750, based at least in part on the particular AGC state value, in accordance with a stepwise supply voltage level adjustment 754 of the graphical representation 706 that can be representative of a portion of the third type of second function or second mapping relating to the second subgroup of AGC state values 752. The stepwise supply voltage level adjustment 754 can span supply voltage levels that can increase in a respective stepwise manner as the AGC state value increases from the first threshold AGC state value 742 towards the second threshold AGC state value 748, wherein the supply voltage can be at one supply voltage level for a first range (e.g., subgroup) of AGC state values and can step up to a higher supply voltage level for a second range (e.g., adjacent subgroup) of AGC state values, and can continue to step up from there as the AGC state value increases up to the second threshold AGC state value 748.

It is to be appreciated and understood that the example graphical representations 700 are merely exemplary graphical representations of respective types of second functions or second mappings of supply voltage levels in relation to AGC state values or AGC states that can be utilized by the second supply voltage controller component to facilitate desirably controlling a supply voltage level supplied to the amplifier component, and, in other embodiments, the second amplifier regulator component and/or the second supply voltage controller component can utilize (e.g., apply or implement) a different type of second function or second mapping of supply voltage levels in relation to AGC state values or AGC states to facilitate desirably controlling a supply voltage level supplied to the amplifier component(s) (e.g., second, third, and/or fourth amplifier components).

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 8:
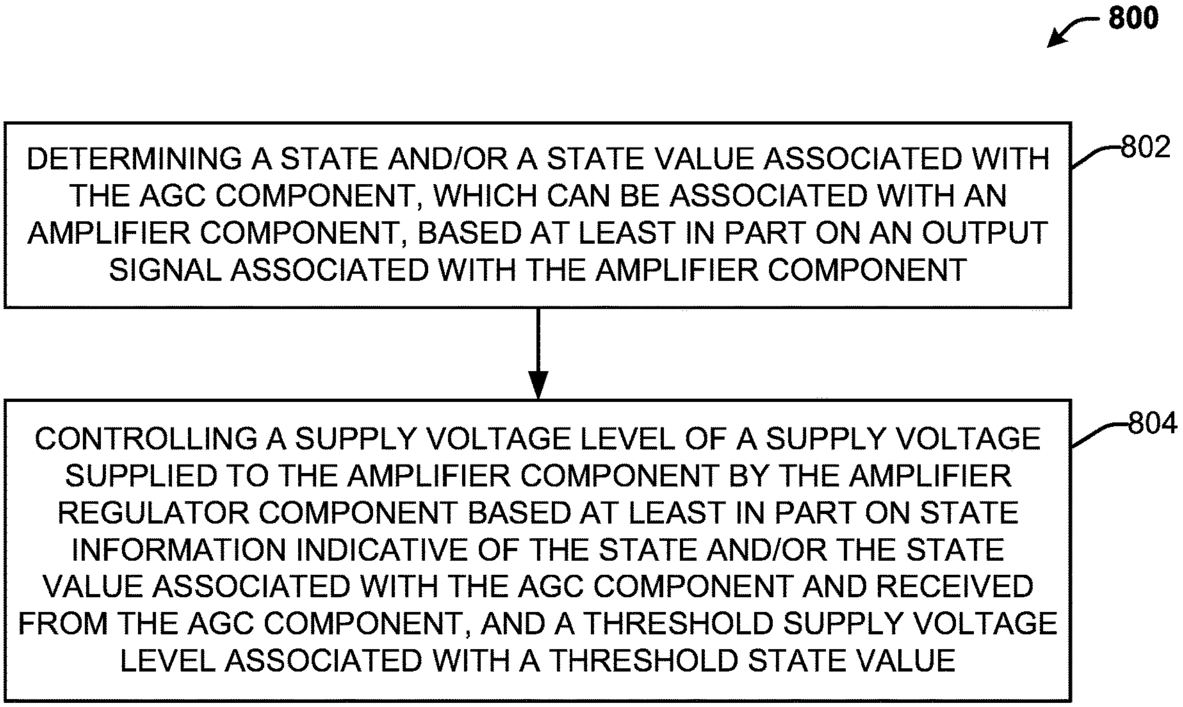
FIG. 8 illustrates a flow chart of an example method that can desirably control and/or adjust a supply voltage level associated with an amplifier component based at least in part on an AGC state value, in accordance with various aspects and embodiments of the disclosed subject matter.
Figure 9:
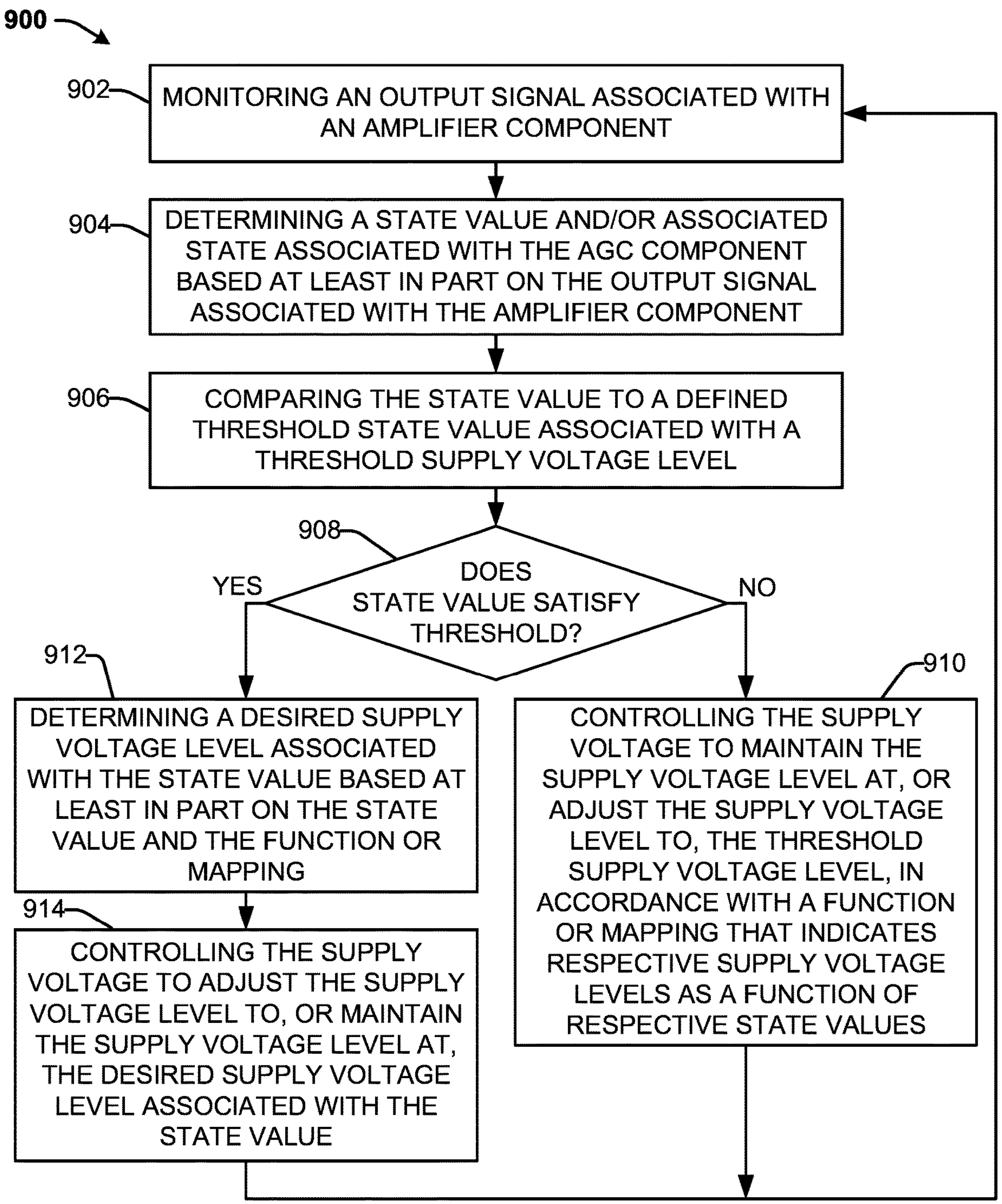
FIG. 9 depicts a flow chart of another example method that can desirably control and/or adjust a supply voltage level associated with an amplifier component based at least in part on an AGC state value, in accordance with various aspects and embodiments of the disclosed subject matter.

In view of the example systems and/or devices described herein, example methods that can be implemented in accordance with the disclosed subject matter can be further appreciated with reference to flowcharts in FIGS. 8-9. For purposes of simplicity of explanation, example methods disclosed herein are presented and described as a series of acts; however, it is to be understood and appreciated that the disclosed subject matter is not limited by the order of acts, as some acts may occur in different orders and/or concurrently with other acts from that shown and described herein. For example, a method disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a method in accordance with the subject specification. It should be further appreciated that the methods disclosed throughout the subject specification are capable of being stored on an article of manufacture to facilitate transporting and transferring such methods to computers for execution by a processor or for storage in a memory.

FIG. 8 illustrates a flow chart of an example method 800 that can desirably (e.g., suitably, acceptably, enhancedly, or optimally) control and/or adjust a supply voltage level associated with an amplifier component based at least in part on an AGC state value, in accordance with various aspects and embodiments of the disclosed subject matter. The method 800 can be employed in connection with a system or device comprising an amplifier component, an AGC component, an amplifier regulator component, a supply voltage controller component, and/or other electrical components or circuitry.

At 802, a state and/or a state value associated with the AGC component, which can be associated with the amplifier component, can be determined based at least in part on an output signal associated with the amplifier component. The system or device can comprise a group of amplifier components, comprising the amplifier component. The group of amplifier components can comprise a TIA component and one or more VGA components, wherein. In some embodiments, the amplifier component can be the TIA component, and, in other embodiments, the amplifier component can be one of the VGA components. The group of amplifier components can be arranged and respectively associated with (e.g., respectively electrically connected) each other, such as described herein. The group of amplifier components can receive an input signal, such as an input current signal, process (e.g., amplify) the input signal, and generate an output signal as an output (e.g., via a buffer component associated with the last amplifier component in the group). The output signal can be utilized for a desired purpose of the system or device.

The AGC component also can receive the output signal as a feedback signal, and can analyze the output signal. The AGC component can determine the state and/or the state value (e.g., AGC state value) associated with the AGC component based at least in part on the result of analyzing the output signal (e.g., an amount of output voltage swing of the output signal), wherein the state value can correspond to or be representative of the state associated with the AGC component.

At 804, a supply voltage level of a supply voltage supplied to the amplifier component by the amplifier regulator component can be controlled based at least in part on state information indicative of the state and/or the state value associated with the AGC component and received from the AGC component, and a threshold supply voltage level associated with a threshold state value. The supply voltage controller component, of or associated with the amplifier regulator component, can control (e.g., manage or adjust) the supply voltage level of the supply voltage supplied to the amplifier component by the amplifier regulator component based at least in part on the state information, comprising the state and/or the state value (e.g., AGC state value), and based at least in part on two (or more) supply voltage levels (e.g., threshold supply voltage levels) and one or more threshold state values and/or threshold states relating to the AGC component and associated with one or more of the threshold supply voltage levels, such as described herein.

FIG. 9 depicts a flow chart of another example method 900 that can desirably (e.g., suitably, acceptably, enhancedly, or optimally) control and/or adjust a supply voltage level associated with an amplifier component based at least in part on an AGC state value, in accordance with various aspects and embodiments of the disclosed subject matter. The method 900 can be employed in connection with a system or device comprising an amplifier component, an AGC component, an amplifier regulator component, a supply voltage controller component, and/or other electrical components or circuitry.

At 902, an output signal associated with the amplifier component can be monitored. The system of device can comprise a group of amplifier components, comprising the amplifier component. The group of amplifier components can comprise a TIA component and one or more VGA components, wherein. In some embodiments, the amplifier component can be the TIA component, and, in other embodiments, the amplifier component can be one of the VGA components. The group of amplifier components can be arranged and respectively associated with (e.g., respectively electrically connected) each other, such as described herein. The AGC component can monitor the output signal (e.g., output voltage swing and/or other characteristics of the output voltage signal) that can be output by the group of amplifier components (e.g., via the buffer component), in response to processing (e.g., converting and amplifying) of an input signal (e.g., input current signal) by the group of amplifier components.

At 904, a state value and/or associated state associated with the AGC component can be determined based at least in part on the output signal associated with the amplifier component. The system or device can comprise a group of amplifier components, comprising the amplifier component. The AGC component can receive and monitor the output signal as a feedback signal, and can analyze the output signal. The AGC component can determine the state value (e.g., AGC state value) and/or associated state associated with the AGC component based at least in part on the result of analyzing the output signal (e.g., an amount of output voltage swing and/or other characteristics of the output signal).

At 906, the state value representative of the state associated with the AGC component can be compared to a defined threshold state value associated with a threshold supply voltage level. The supply voltage controller component, of or associated with the amplifier regulator component, can receive state information, comprising the state value, from the AGC component. The supply voltage controller component can compare the state value (e.g., AGC state value) to the defined threshold state value (e.g., threshold AGC state value). The defined threshold state value can be associated with (e.g., can be mapped or linked to) the threshold supply voltage level.

At 908, based at least in part on the result of the comparison, a determination can be made regarding whether the state value satisfies the defined threshold state value. The supply voltage controller component can determine whether the state value satisfies (e.g., exceeds) the defined threshold state value based at least in part on the result of the comparison the state value representative of the state associated with the AGC component to the defined threshold state value.

If it is determined that the state value does not satisfy the defined threshold state value, at 910, the supply voltage can be controlled to maintain the supply voltage level at, or adjust the supply voltage level to, the threshold supply voltage level, in accordance with a function or mapping that indicates respective supply voltage levels as a function of respective state values. For instance, if the supply voltage controller component determines that the state value does not satisfy (e.g., does not exceed, or is not greater than) the defined threshold state value, the supply voltage controller component can control the supply voltage supplied to the amplifier component to maintain the supply voltage level of the supply voltage at the threshold supply voltage level (e.g., if it is already at the threshold supply voltage level), or adjust the supply voltage level to the threshold supply voltage level, in accordance with the function or mapping. For instance, the function or mapping can indicate or specify that, for state values below the defined threshold state value, the supply voltage level is to be at the threshold supply voltage level. At this point, the method 900 can proceed back to reference numeral 902, wherein the method 900 can proceed from that point to monitor the output signal (e.g., the next output signal) associated with the amplifier component.

Referring again to reference numeral 908, if, instead, at 908, it is determined that the state value satisfies the defined threshold state value, at 912, a desired supply voltage level associated with the state value can be determined based at least in part on the state value and the function or mapping that indicates respective supply voltage levels as a function of respective state values. If the supply voltage controller component determines that the state value satisfies (e.g., is at, or exceeds or is greater than) the defined threshold value, the supply voltage controller component can determine the desired (e.g., wanted, target, suitable, or optimal) supply voltage level associated with (e.g., mapped, linked, or corresponding to) the state value and/or associated state based at least in part on the state value (and/or associated state) and the function or mapping that indicates the respective supply voltage levels as a function of the respective state values (e.g., respective AGC state values), such as described herein. The function or mapping can be based at least in part on the threshold (e.g., first threshold) supply voltage level and a second threshold supply voltage level, wherein one of the first and second threshold supply voltage levels can be a higher (e.g., highest) supply voltage level and the other one can be a lower (e.g., lowest) supply voltage level associated with (e.g., applicable to or utilized for) the amplifier component, such as described herein.

At 914, the supply voltage can be controlled to adjust the supply voltage level to, or maintain the supply voltage level at, the desired supply voltage level associated with the state value. For instance, in response to the supply voltage controller component determining the desired supply voltage level, the supply voltage controller component can control the supply voltage supplied to the amplifier component to adjust the supply voltage level of the supply voltage to the desired supply voltage level associated with the AGC state value and/or associated AGC state, or maintain the supply voltage level at the desired supply voltage level (e.g., if it is already at the desired supply voltage level). At this point, the method 900 can proceed back to reference numeral 902, wherein the method 900 can proceed from that point to monitor the output signal (e.g., next output signal) associated with the amplifier component.

Reference throughout this specification to "one embodiment," "an embodiment," "an example", "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one example," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like can refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, or other component) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source (s), signal generator(s), communication bus (ses), controllers, I/O interface, address registers, and so on. It is to be appreciated that some overlap in definitions is anticipated, and an architecture or a system can be a stand-alone component, or a component of another architecture, system, device, or structure.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips, or other type of magnetic storage device), optical disks (e.g., compact disk (CD), digital versatile disk (DVD), or other type of optical disk), smart cards, and flash memory devices (e.g., card, stick, key drive, or other type of flash memory device). Computer-readable transport media can include carrier waves, or the like. Of course, those skilled in the art will recognize many modifications can be made to this configuration without departing from the scope or spirit of the disclosed subject matter.

What has been described above includes examples of the disclosed subject matter. It is, of course, not possible to describe every conceivable combination of components or methods for purposes of describing the disclosed subject matter, but one of ordinary skill in the art can recognize that many further combinations and permutations of the disclosed subject matter are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A system that facilitates control of supply voltage levels, comprising:

a group of amplifier components, comprising an amplifier component, wherein the group of amplifier components receives an input signal, wherein the group of amplifier components generates a voltage signal based at least in part on the input signal, and wherein an output signal of the system is based at least in part on the voltage signal;

an automatic gain control component associated with the group of amplifier components, wherein the automatic gain control component determines a state value associated with the automatic gain control component, based at least in part on an analysis of the output signal; and a supply voltage controller component that receives state information indicative of the state value from the automatic gain control component and controls a supply voltage level of a supply voltage supplied by an amplifier regulator component to the amplifier component based at least in part on the state value and a threshold supply voltage level associated with a threshold state value.

2. The system of claim 1, wherein the supply voltage controller component compares the state value to the threshold state value and, based at least in part on a result of the comparison of the state value to the threshold state value, determines whether the state value satisfies the threshold state value.

3. The system of claim 2, wherein the supply voltage controller component controls the supply voltage level to maintain the supply voltage level at, or adjust the supply voltage level to, the threshold supply voltage level based at least in part on the result indicating that the state value does not satisfy the threshold state value.

4. The system of claim 2, wherein, based at least in part on the result indicating that the state value satisfies the threshold state value, the supply voltage controller component determines a specified supply voltage level associated with the state value based at least in part on the state value and a mapping that indicates respective supply voltage levels as a function of respective state values, and controls the supply voltage level to maintain the supply voltage level at, or adjust the supply voltage level to, the specified supply voltage level.

5. The system of claim 4, wherein the amplifier component is a transimpedance amplifier component, wherein the threshold supply voltage level is a threshold high supply voltage level, and wherein the specified supply voltage level is lower than the threshold high supply voltage level and higher than a threshold low supply voltage level, in accordance with the state value and the mapping.

6. The system of claim 4, wherein the amplifier component is a voltage gain amplifier component, wherein the threshold supply voltage level is a threshold low supply voltage level, and wherein the specified supply voltage level is higher than the threshold low supply voltage level and lower than a threshold high supply voltage level, in accordance with the state value and the mapping.

7. The system of claim 2, wherein the amplifier component is a transimpedance amplifier component, wherein the threshold supply voltage level is a threshold high supply voltage level, wherein the threshold state value is a threshold lower state value, wherein, based at least in part on the result indicating that the state value satisfies the threshold lower state value and a threshold higher state value that is associated with a threshold low supply voltage level, the supply voltage controller component controls the supply voltage level to maintain the supply voltage level at, or adjust the supply voltage level to, the threshold low supply voltage level, in accordance with a mapping that indicates respective supply voltage levels as a function of respective state values.

8. The system of claim 2, wherein the amplifier component is a voltage gain amplifier component, wherein the threshold supply voltage level is a threshold low supply voltage level, wherein the threshold state value is a threshold lower state value, wherein, based at least in part on the result indicating that the state value satisfies the threshold lower state value and a threshold higher state value that is associated with a threshold high supply voltage level, the supply voltage controller component controls the supply voltage level to maintain the supply voltage level at, or adjust the supply voltage level to, the threshold high supply voltage level, in accordance with a mapping that indicates respective supply voltage levels as a function of respective state values.

9. A system that facilitates control of supply voltage levels comprising:

a group of amplifier components, comprising an amplifier component, wherein the group of amplifier components receives an input signal, wherein the group of amplifier components generates a voltage signal based at least in part on the input signal, and wherein an output signal of the system is based at least in part on the voltage signal;

an automatic gain control component associated with the group of amplifier components, wherein the automatic gain control component determines a state value associated with the automatic gain control component, based at least in part on an analysis of the output signal; and a supply voltage controller component that receives state information indicative of the state value from the automatic gain control component and controls a supply voltage level of a supply voltage supplied by an amplifier regulator component to the amplifier component based at least in part on the state value and a threshold supply voltage level associated with a threshold state value, wherein the supply voltage controller component comprises a resistor component, a first current source component, and one of a second current source component or a current sink component that are associated with a node associated with an input of a regulator component of the amplifier regulator component, wherein the first current source component provides a first current at a first current level to the node, wherein, based at least in part on the state value being determined to satisfy the threshold state value, and in accordance with the state value, the second current source component provides a second current at a second current level to the node to increase an amount of current at the node from the first current level to a third current level, or the current sink component sinks or diverts a portion of the first current from the node to reduce the current at the node to a fourth current level, wherein a reference voltage signal is generated at the node and provided to the input of the regulator component to facilitate generation of the supply voltage at the supply voltage level as an output of the amplifier regulator component based at least in part on the current, at the third current level or the fourth current level, at the node and a resistance value of the resistor component, and wherein a reference voltage level of the reference voltage signal corresponds to the supply voltage level.

10. The system of claim 9, wherein the threshold supply voltage level, the threshold state value, a first current value associated with the first current source component, a second current value associated with the second current source component or the current sink component, or a mapping that indicates respective supply voltage levels as a function of respective state values is programmable, settable, or adjustable.

11. A device that facilitates management of supply voltage levels, comprising:

a group of amplifier components, comprising an amplifier component, wherein the group of amplifier components receives an input signal, wherein the group of amplifier components generates a voltage signal based at least in part on the input signal, and wherein an output signal associated with the group of amplifier components is based at least in part on the voltage signal;

an automatic gain control component associated with the group of amplifier components, wherein the automatic gain control component determines a state value associated with the automatic gain control component, based at least in part on an analysis of the output signal; and a supply voltage controller component that receives a state signal indicative of the state value from the automatic gain control component and manages a supply voltage level of a supply voltage supplied by an amplifier regulator component to the amplifier component based at least in part on a result of a determination of whether the state value satisfies a threshold state value associated with a threshold supply voltage level.

12. The device of claim 11, wherein the group of amplifier components comprises a transimpedance amplifier component and a voltage gain amplifier component associated with the transimpedance amplifier component, wherein the amplifier component is the transimpedance amplifier component, wherein the amplifier regulator component is a first amplifier regulator component, wherein the supply voltage controller component is a first supply voltage controller component, wherein the supply voltage level is a first supply voltage level, wherein the supply voltage is a first supply voltage, wherein the result is a first result, wherein the determination is a first determination, wherein the threshold state value is a first threshold state value, wherein the threshold supply voltage level is a first threshold supply voltage level, and wherein the device further comprises:

a second supply voltage controller component that receives the state signal indicative of the state value from the automatic gain control component and manages a second supply voltage level of a second supply voltage supplied by a second amplifier regulator component to the voltage gain amplifier component based at least in part on a second result of a second determination of whether the state value satisfies a second threshold state value associated with a second threshold supply voltage level.

13. The device of claim 12, wherein the first supply voltage controller component manages the first supply voltage level to maintain the first supply voltage level at, or adjust the supply voltage level to, the first threshold supply voltage level based at least in part on the first result indicating that the state value does not satisfy the first threshold state value, in accordance with a first function that indicates respective first supply voltage levels in relation to respective state values; and wherein the second supply voltage controller component manages the second supply voltage level to maintain the second supply voltage level at, or adjust the supply voltage level to, the second threshold supply voltage level based at least in part on the second result indicating that the state value does not satisfy the second threshold state value, in accordance with a second function that indicates respective second supply voltage levels in relation to respective state values, wherein the first threshold supply voltage level is a threshold high supply voltage level, and wherein the second threshold supply voltage level is a threshold low supply voltage level that is lower than the threshold high supply voltage level.

14. The device of claim 12, wherein, based at least in part on the first result indicating that the state value satisfies the first threshold state value, the first supply voltage controller component determines a specified supply voltage level associated with the state value based at least in part on the state value and a first function that indicates respective first supply voltage levels in relation to respective state values, and manages the first supply voltage level to maintain the first supply voltage level at, or adjust the first supply voltage level to, the specified supply voltage level, wherein the first threshold supply voltage level is a threshold high supply voltage level, and wherein the specified supply voltage level is lower than the threshold high supply voltage level and higher than a threshold low supply voltage level, in accordance with the state value and the first function.

15. The device of claim 12, wherein, based at least in part on the second result indicating that the state value satisfies the second threshold state value, the second supply voltage controller component determines a specified supply voltage level associated with the state value based at least in part on the state value and a second function that indicates respective second supply voltage levels in relation to respective state values, and manages the second supply voltage level to maintain the second supply voltage level at, or adjust the second supply voltage level to, the specified supply voltage level, wherein the second threshold supply voltage level is a threshold low supply voltage level, and wherein the specified supply voltage level is higher than the threshold low supply voltage level and lower than a threshold high supply voltage level, in accordance with the state value and the second function.

16. The device of claim 11, wherein the amplifier component is a transimpedance amplifier component, wherein the threshold supply voltage level is a threshold high supply voltage level, wherein the threshold state value is a threshold lower state value, wherein, based at least in part on the result indicating that the state value satisfies the threshold lower state value and a threshold higher state value that is associated with a threshold low supply voltage level, the supply voltage controller component manages the supply voltage level to maintain the supply voltage level at, or adjust the supply voltage level to, the threshold low supply voltage level, in accordance with a function that indicates respective supply voltage levels in relation to respective state values.

17. A method that facilitates controlling supply voltage levels, comprising:

determining a state value indicative of a state associated with an automatic gain control component based at least in part on analysis of an output signal associated with a group of amplifiers, comprising an amplifier component, associated with the automatic gain control component; and controlling a supply voltage level of a supply voltage supplied to the amplifier component based at least in part on a threshold supply voltage level associated with a threshold state value, and state information indicative of the state value and received from the automatic gain control component.

18. The method of claim 17, further comprising:

comparing the state value to the threshold state value; and controlling the supply voltage level to maintain the supply voltage level at, or adjust the supply voltage level to, the threshold supply voltage level based at least in part on a result of the comparing indicating that the state value does not satisfy the threshold state value.

19. The method of claim 17, further comprising:

comparing the state value to the threshold state value;

in response to a result of the comparing indicating that the state value satisfies the threshold state value, determining a specified supply voltage level associated with the state value based at least in part on the state value and a function or a mapping that indicates respective supply voltage levels in relation to respective state values; and based at least in part on the determining of the specified supply voltage level, controlling the supply voltage level to maintain the supply voltage level at, or adjust the supply voltage level to, the specified supply voltage level.

20. The method of claim 19, wherein the amplifier component is a transimpedance amplifier component, wherein the threshold supply voltage level is a threshold high supply voltage level, and wherein the specified supply voltage level is lower than the threshold high supply voltage level and higher than a threshold low supply voltage level, in accordance with the state value and the mapping; or wherein the amplifier component is a voltage gain amplifier component, wherein the threshold supply voltage level is a threshold low supply voltage level, and wherein the specified supply voltage level is higher than the threshold low supply voltage level and lower than a threshold high supply voltage level, in accordance with the state value and the mapping.

* * * * *